US012645848B2

(12) United States Patent
Brifault et al.

(10) Patent No.: US 12,645,848 B2
(45) Date of Patent: Jun. 2, 2026

(54) PROCESSING A CAD 3D MODEL OF A MECHANICAL PART

(71) Applicant: DASSAULT SYSTEMES, Velizy Villacoublay (FR)

(72) Inventors: Lucas Brifault, Vélizy-Villacoublay (FR); Ariane Jourdan, Vélizy-Villacoublay (FR); Serban Alexandru State, Vélizy-Villacoublay (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 968 days.

(21) Appl. No.: 17/805,406

(22) Filed: Jun. 3, 2022

(65) Prior Publication Data

US 2022/0398356 A1 Dec. 15, 2022

(30) Foreign Application Priority Data

Jun. 4, 2021 (EP) .................................... 21305763

(51) Int. Cl.
*G06F 30/10* (2020.01)
*G06F 30/17* (2020.01)

(52) U.S. Cl.
CPC .................................... *G06F 30/17* (2020.01)

(58) Field of Classification Search
CPC ....... G06F 30/17; G06F 2111/10; G06F 30/10
See application file for complete search history.

(56) References Cited

U.S. PATENT DOCUMENTS

| | | | |
|---|---|---|---|
| 7,050,951 B1 * | 5/2006 | Tautges ................... | G06T 17/10 |
| | | | 703/2 |
| 7,492,364 B2 * | 2/2009 | Devarajan ............... | G06T 17/00 |
| | | | 345/419 |
| 10,956,625 B2 * | 3/2021 | Makem ................... | G06T 17/20 |
| 2013/0018634 A1 | 1/2013 | Bae et al. | |
| 2020/0043186 A1 | 2/2020 | Selviah et al. | |

(Continued)

FOREIGN PATENT DOCUMENTS

| | | |
|---|---|---|
| CN | 111383341 A | 7/2020 |
| JP | 2005-149245 A | 6/2005 |

(Continued)

OTHER PUBLICATIONS

Anonymous: "SurfMaster 4 User Manual" Dec. 31, 2013 (Dec. 31, 2013), XP055855009.

(Continued)

*Primary Examiner* — Rehana Perveen
*Assistant Examiner* — John David Hagler
(74) *Attorney, Agent, or Firm* — Oblon, McClelland, Maier & Neustadt, L.L.P.

(57) ABSTRACT
A computed-implemented method for processing a computer-aided design 3D model of a mechanical part including a portion having a distribution of material. The method including obtaining the 3D model, the 3D model including a skin portion of the 3D model representing an outer surface of the portion of the mechanical part. The method further including processing the skin portion based on an extrusion-processing algorithm, where a transform of the skin portion is inputted to the algorithm. The transform represents an unfolding of the distribution of material of the portion.

20 Claims, 6 Drawing Sheets

(56) References Cited

U.S. PATENT DOCUMENTS

| | | |
|---|---|---|
| 2020/0151286 A1 | 5/2020 | Willis et al. |
| 2020/0211279 A1 | 7/2020 | Randon et al. |

FOREIGN PATENT DOCUMENTS

| | | |
|---|---|---|
| JP | 2010-282538 A | 12/2010 |
| JP | 2016-045781 A | 4/2016 |
| JP | 2016-118502 A | 6/2016 |
| JP | 2020-115338 A | 7/2020 |
| JP | 2020-115339 A | 7/2020 |
| WO | 2008/100248 A3 | 8/2008 |
| WO | 2019/087032 A1 | 5/2019 |

OTHER PUBLICATIONS

Bénière et. al., Recovering Primitives in 3D CAD meshes, Proceedings of SPIE 2011.

P. Benko et al., Algorithms for reverse engineering boundary representation models, Computer-Aided Design 33, 2001, pp. 389-851.

Chuang J-H et al., A potential-based generalized cylinder representation11, Computers and Graphics, Elsevier, GB, vol. 28, No. 6, Dec. 1, 2004.

Cohen-Steiner D., and Morvan J.-M., 2003. Restricted Delaunay Triangulations and Normal Cycle. In ACM Symp. on Computational Geometry.

European Search Report No. EP21305671.6, issued Nov. 12, 2021.

European Search Report No. EP21305673.2, issued Nov. 12, 2021.

European Search Report No. EP21305763.1, issued Nov. 8, 2021.

Geng et al., "A thin-plate cad mesh model splitting approach based on fitting primitives", EG UK Theory and Practice of Computer Graphics, 2010, pp. 45-50.

Goshtasby, Grouping and Parameterizing Irregularly Spaced Points for Curve Fitting, ACM Transactions on Graphics, 19(3), 2000, pp. 185-203.

Kaiser A. et al., A Survey of Simple Geometric Primitives Detection Methods for Captured 3D data, Computer Graphics Forum 2018.

Knoppel F., Crane K., Pinkall U., and Schroder P. 2013. Globally Optimal Direction Fields. ACM Trans. Graph.

Bruno Lévy, Sylvain Petitjean, Nicolas Ray, Jérôme Maillot. *Least Squares Conformal Maps for Automatic Texture Atlas Generation.* ACM Transactions on Graphics, Association for Computing Machinery, 2002, 21 (3), 10 p.

Patrick Mullen, Yiying Tong, Pierre Alliez, Mathieu Desbrun. Spectral Conformal Parameterization. Computer Graphics Forum, Wiley, 2008, Eurographics Symposium on Geometry Processing, 27 (5), pp. 1487-1494. ffinria-00334477f.

Northwind97: Brep Surfaces Youtube, "Rhino Unfolds Mulit-Face Into A Single Contour", Aug. 10, 2012 (Aug. 10, 2012), p. 1 pp. , XP054982397.

H. Pottmann, H.-Y. Chen, I.-K. Lee. Approximation by Profile Surfaces. The Mathematics of Surfaces VIII, A. Ball et al. (Eds), pp. 17-36, Information Geometers, 1998.

R. Schnabel, R. Wahl, R. Klein, Efficient RANSAC for Point-Cloud Shape Detection, Computer Graphics Forum 26 (2) (2007) 214-226.

A. Tumanin, Polygonal Mesh to B-rep Solid Conversion: Algorithm Detail and C++ Code Samples, Habr Website Sep. 4, 2019.

J. Wang, D. xiao Gu, Z. Yu, C. Tan, L. Zhou, A framework for 3d model reconstruction in reverse engineering, Computers & Industrial Engineering 63 (4) (2012) 1189-1200.

Wang et . al. Fitting B-Spline Curves to point clouds using curvature-based square distance minimization, CM Transactions on Graphics, 25(2), 2006, pp. 214-238.

Wu, ChangChang et al.: "Schematic surface reconstruction" Computer Vision and Pattern Recognition (CVPR), 2012 IEEE Conference On, IEEE, Jun. 16, 2012 (Jun. 16, 2012), pp. 1498-1505, XP032232238.

Boussuge et al., "Idealized Models for FEA Derived from Generative Modeling Processes Based on Extrusion Primitives", Engineering with Computers, Retrieved from the Internet [URL:https://hal.inria.fr/hal-01108462/document], vol. 31, 2015, 17 pages, XP055887737.

European Office Action issued Dec. 8, 2025 in European Patent Application No. 21306184.9, 7 pages.

Office Action dated Jan. 27, 2026, issued in counterpart JP Application No. 2022-081420, with English Translation. (6 pages).

P.A. Fayolle et al. "3D shape reconstruction of template models using genetic algorithms", Proceedings of the 17th International Conference on Pattern Recognition, 2004. ICPR 2004, 2004 pp. 269-272, vol. 2. (4 pages).

Abe, Osamu et al., "Prototype of 3D sketch input front-end processor BlueGrottoFEP", 2005, with machine translation. (5 pages).

Kazhdan, Michael et al. "Screened poisson surface reconstruction" ACM Transactions on Graphics Jun. 2013 vol. 32 No. 3 pp. 1-13. (13 pages).

Tarini, Marco et al., "Simple quad domains for field aligned mesh parametrization", ACM Transactions on Graphics, Dec. 2011 vol. 30 ; No. 6. (11 pages).

Yu, Yizhou et al., "Mesh editing with poisson-based gradient field manipulation", ACM Transactions on Graphics, Aug. 2004 vol. 23: No. 3. (8 pages).

Office Action dated Feb. 10, 2026, issued in counterpart JP Application No. 2022-081416, (5 pages).

Office Action dated Feb. 17, 2026, issued in counterpart JP Application No. 2022-134158, with English Translation. (6 pages).

* cited by examiner

3010

3020

4010

4020

PROCESSING A CAD 3D MODEL OF A MECHANICAL PART

CROSS-REFERENCE TO RELATED APPLICATIONS

This application claims priority under 35 U.S.C. § 119 or 365 to European Application No. 21305763.1, filed Jun. 4, 2021. The entire contents of the above application are incorporated herein by reference.

TECHNICAL FIELD

The disclosure relates to the field of computer programs and systems, and more specifically to a method, system and program for processing a computer-aided design (CAD) 3D model of a mechanical part.

BACKGROUND

A number of systems and programs are offered on the market for the design, the engineering and the manufacturing of objects. CAD is an acronym for Computer-Aided Design, e.g., it relates to software solutions for designing an object. CAE is an acronym for Computer-Aided Engineering, e.g., it relates to software solutions for simulating the physical behavior of a future product. CAM is an acronym for Computer-Aided Manufacturing, e.g., it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systèmes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Some of these systems and programs provide functionalities for processing CAD models of mechanical parts.

Wang et al., "*A Framework for 3D Model Reconstruction in Reverse Engineering*", Computers & Industrial Engineering, 63(4), 2012, pp. 1189-1200, presents a framework for 3D model reconstruction. The framework, composed of four main components, provides a systematic solution to reconstruct geometric model from the surface mesh of an existing object. First, the input mesh is pre-processed to filter-out noise. Second, the mesh is partitioned into segments to obtain individual geometric feature patches. Then, two integrated solutions, namely solid feature-based strategy and surface feature-based strategy, are exploited to reconstruct primitive features from the segmented feature patches. Finally, the modeling operations, such as solid Boolean and surface trimming operations, are performed to assemble the primitive features into the final model.

Pottmann et al., "*Approximation by Profile Surfaces*", The Mathematics of Surfaces VIII, A. Ball et al. (Eds), Information Geometers, 1998, pp. 17-36, discloses an algorithm for approximation of a given surface or scattered points by a surface of revolution is presented. It forms the basis for a study of approximation with profile surfaces. Those are sweeping surfaces traced out by a planar curve when its plane is rolling on a developable surface. Important special cases include developable surfaces and pipe surfaces, where the moving curve is a straight line or circle, respectively.

Schnabel et al., "*Efficient RANSAC for Point-Cloud Shape Detection*", Computer Graphics Forum, 26(2), 2007, pp. 214-226, presents an automatic Random Sample Consensus (RANSAC) algorithm to detect basic shapes in unorganized point clouds. The algorithm decomposes the point cloud into a concise, hybrid structure of inherent shapes and a set of remaining points. Each detected shape serves as a proxy for a set of corresponding points. The algorithm is based on random sampling and detects planes, spheres, cylinders, cones, and tori.

Geng et al., "*A thin-plate cad mesh model splitting approach based on fitting primitives*", EG UK Theory and Practice of Computer Graphics, 2010, pp. 45-50, discloses an algorithm based on primitive fitting for segmenting thin-plate CAD mesh models into parts of three different types, two of which are extruding surfaces and the other is a lateral surface. This method may be used for solid model reconstruction in the SDD process and involves two steps. First, a completely automatic method for accurate primitive fitting on CAD meshes is proposed based on the hierarchical primitive fitting framework. In the second step, a procedure is proposed for splitting thin-plate CAD mesh models by detecting parallel extruding surfaces and lateral surfaces.

Within this context, there is still a need for an improved solution for processing CAD models of mechanical parts.

SUMMARY

It is therefore provided a computer-implemented method for processing a computer-aided design (CAD) 3D model of a mechanical part including a portion having a distribution of material. The method comprises providing the 3D model, the 3D model including a skin portion of the 3D model representing an outer surface of the portion of the mechanical part. The method further comprises processing the skin portion based on an extrusion-processing algorithm, where a transform of the skin portion is inputted to the algorithm. The transform represents an unfolding of the distribution of material of the portion.

The method may comprise one or more of the following:

- processing the skin portion based on an extrusion-processing algorithm comprises:
  - unfolding the skin portion, thereby obtaining the transform;
  - inputting the transform to the extrusion-processing algorithm; and
  - running the extrusion-processing algorithm;
- the extrusion-processing algorithm comprises:
  - determining whether or not the transform of the skin portion represents an outer surface of a distribution of material arranged as an extrusion; and/or
  - computing an extrusion profile;
- the processing of the skin portion based on an extrusion-processing algorithm comprises a material revolution detection in the portion of the mechanical part, the material revolution detection comprising determining a revolution axis by optimizing an objective function penalizing non-orthogonality of a normal of the skin portion to a rotation direction orthogonal to a candidate revolution axis to an extent which is increasingly proportional to a distance to the revolution axis;

the objective function is of the type:

$$\mathcal{J}_R(u, c) = \frac{1}{\mathcal{A}_s}\int_S \frac{1}{|p - \pi_{c,u}(p)|}(u \times (p - c) \cdot n)^2 dvol_S,$$

where u is a direction of the candidate revolution axis, c is an origin of the candidate revolution axis, $\mathcal{A}_S$ is an area of the skin portion, S is the skin portion, p is a position on the skin portion, $\pi_{c,u}(p)$ is an orthogonal projection of p on the candidate revolution axis, and n is a normal to the skin portion at position p;

the unfolding comprises:

providing a revolution axis;

determining a cylindrical coordinate specification of the skin portion, the cylindrical coordinate specification including first values each specifying a respective position on the skin portion relative to a cylindrical coordinate system having a longitudinal axis which is the revolution axis; and determining a Cartesian coordinate specification of the transform, relative to a Cartesian coordinate system having one axis which is the longitudinal axis, the Cartesian coordinate specifications including second values specifying positions on the transform, the second values corresponding to the first values;

the skin portion is represented by a 3D discrete geometrical representation having discrete elements and the determining of the cylindrical coordinate specification of the skin portion comprises determining the first values for each discrete element of the 3D discrete geometrical representation;

the first values of the cylindrical coordinate specification consist of, for each discrete element, values of:

a radial distance which is a norm of a radial vector with respect to the longitudinal axis, an angular position on the skin portion with respect to the radial vector and the longitudinal axis, and a longitudinal position which designates a position on the longitudinal axis;

the determining of the cylindrical coordinate specification comprising computing the values of the angular position by exploring discrete elements of the 3D discrete geometrical representation and, for each explored discrete element, computing the angular positions of neighboring discrete elements of the explored discrete element;

the computing of the values of the angular position of neighboring discrete elements of the explored discrete element comprises duplicating one or more of the neighboring discrete elements for which the difference with the angular position of the explored discrete element is larger than a threshold;

the values of the angular position are of the type:

$$e_i = \frac{p_i - (p_i \cdot u)u}{|p_i - (p_i \cdot u)u|}$$

$$\cos(\theta_{i+1} - \theta_i) = e_i \cdot e_{i+1}$$

$$\sin(\theta_{i+1} - \theta_i) = (e_i \times e_{i+1}) \cdot u,$$

where u is the longitudinal axis, $p_i$ is a cartesian position vector of an explored discrete element i, $\theta_i$ is a value of the angular position for the explored discrete element,

4

$\theta_{i+1}$ is a value of the angular position of a neighbor i+1 of the explored discrete element i; and/or the method further comprises scaling the values of the angular position.

It is further provided a computer program comprising instructions for performing the method.

It is further provided a computer readable storage medium having recorded thereon the computer program.

It is further provided a system comprising a processor coupled to a memory, the memory having recorded thereon the computer program.

BRIEF DESCRIPTION OF THE DRAWINGS

Non-limiting examples will now be described in reference to the accompanying drawings, where.

DETAILED DESCRIPTION

Figure 1:
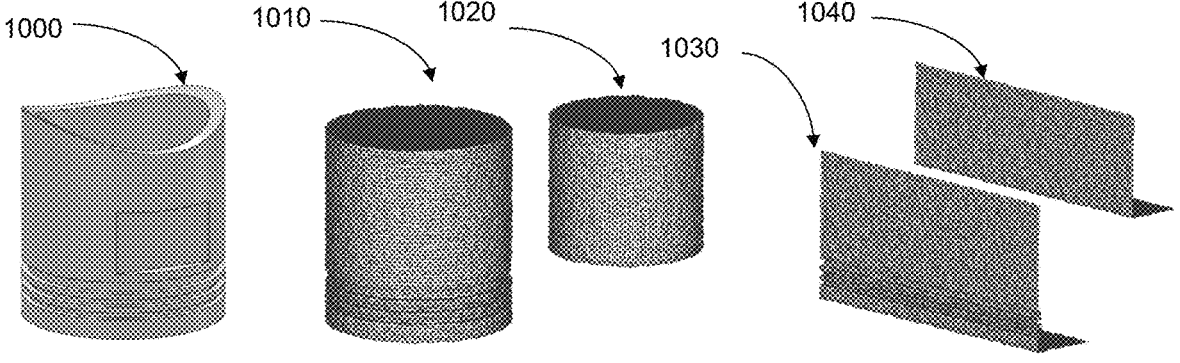
FIGS. 1, 2, 3, 4, 5, 6, 7, 8, 9 and 10 illustrate the method.

It is hereby proposed a computer-implemented method for processing a computer-aided design (CAD) 3D model of a mechanical part. The mechanical part includes a portion which has a distribution of material. The method comprises providing the 3D model. The 3D model includes a skin portion of the 3D model. The skin portion represents an outer surface of the portion of the mechanical part. The method further comprises processing the skin portion based on an extrusion-processing algorithm, where a transform of the skin portion is inputted to the algorithm. The transform represents an unfolding of the distribution of material of the portion.

This constitutes an improved solution for processing a CAD 3D model of a mechanical part. Notably, the method processes the skin portion based on an extrusion-processing algorithm by inputting a transform of the skin portion to the extrusion-processing algorithm. The transform of the skin portion represents an unfolding of the material distribution of the portion, i.e., the transform of the skin portion forms an unfolded skin portion that represents the material distribution as unfolded. By using a transform of the skin portion, the method allows processing of the skin portion by applying an extrusion-processing algorithm to the skin portion (i.e., once transformed). Thereby the method allows applying extrusion processing methods in order to process other types of surfaces (i.e., skin portions which are not extrusions). For example, a revolution surface may be unfolded into an extrusion surface using the transform provided by the method, and may then be processed by an extrusion-processing algorithm according to the method. Thereby, the method may process revolution surfaces by using known extrusion-processing algorithms applied to the transform of these revolution surfaces.

The extrusion-processing algorithm applied by the method to the transform of the skin portion may output some characteristics (i.e., properties) of the inputted transform of the skin portion (e.g., an extrusion when the skin portion is a revolution surface). Each of such characteristics corresponds to a respective characteristic of the skin portion according to the transform (e.g., up to an inverse of the transform). In other words, the extrusion-processing algorithm may output one or more characteristics of the transform, these one or more characteristics corresponding to one or more characteristics of the skin portion up to the inverse of the transform. For example, the extrusion-processing algorithm may take as input a transform of a revolution surface, which is an extrusion surface, and may output a parametrization of the extrusion surface or a computed extrusion profile of the extrusion surface.

The extrusion-processing algorithm may be any algorithm that allows detection of an extrusion, parameterization of an extrusion and/or edition of an extrusion. For example, the extrusion-processing algorithm may comprise an extrusion detection method according to European Patent Application European Patent Application No. EP21305673.2 filed on 21 May 2021 by DASSAULT SYSTEMES, which is incorporated herein by reference, to determine whether or not the transform of the skin portion represents an outer surface of a distribution of material arranged as an extrusion. Specifically, the extrusion-processing algorithm may comprise a step of material extrusion detection in the transform of the skin portion, .i.e., determining whether or not the transform of the skin portion is an extrusion surface, by applying the computer-implemented method for material extrusion detection disclosed in previously-cited European Patent Application No. 21305673.2 to the transform of the skin portion (i.e., the transform of the skin portion plays the role of the skin portion in the method for material extrusion detection disclosed in previously-cited European Patent Application No. 21305673.2). This enables the processing method to assess a shape of the material distribution represented by the skin portion before being unfolded. For example, the transform of a revolution surface being an extrusion surface, the application of the extrusion-processing algorithm by the method to the transform of a revolution detects whether or not the transform is an extrusion surface, which corresponds to detecting whether or not the skin portion represents an outer surface of a distribution of material arranged as a revolution. Alternatively or additionally, the extrusion processing algorithm may comprise determining a revolution axis for the skin portion by optimizing an objection function obtained from transforming an objective function for determining an extrusion direction. Additionally or alternatively, the extrusion-processing algorithm may comprise a parametrization method according to European Patent Application No. 21305671.6 filed on 21 May 2021 by DASSAULT SYSTEMES, which is incorporated herein by reference, to determine one or more first distributions of values of one or more respective parameters on the transform of the skin portion. Specifically, the extrusion-processing algorithm may comprise a step of parameterizing the transform of the skin portion, determining one or more first distributions of values each of a respective parameter of the transform of the skin portion, by applying the computer-implemented method for parameterization disclosed in previously-cited European Patent Application No. 21305671.6 to the transform of the skin portion. This allows to determine a corresponding one or more second distributions of values of one or more respective parameters on the skin portion (e.g., by considering (e.g., applying) an inverse of the transform to the one or more first distributions of values). Each respective one of the second distribution of values corresponds to a respective first distribution of values according to the transform. This enables the processing method to parametrize a skin portion (e.g., a revolution surface) by parameterizing the transform of the skin portion (e.g., an extrusion surface) using an extrusion-processing algorithm. Such a processing of CAD models, that the method enables, for example for surface detection (e.g., revolution surface detection) or parameterization (e.g., revolution surface parameterization), is particularly relevant in the field of manufacturing CAD, as explained hereinafter.

In addition, the processing of a skin portion of a 3D model by processing a respective transform of the skin portion improves the processing by making it more robust to noise. In other words, the CAD model may a noisy CAD model (e.g., featuring a noise due to outlier points, notably when the 3D model is a 3D point cloud, or due to the non-smoothness of the outer surface of the CAD model, notably when the 3D model is a 3D mesh). Indeed, the method allows processing of the skin portion by applying an extrusion-processing algorithm, for example a parameterization method according to previously-cited European Patent application No. 21305671.6, or an extrusion detection method according to previously-cited European Patent application No. 21305673.2, both methods being particularly robust to noise. Specifically, the method may process a skin portion based on an extrusion-processing algorithm comprising a step of material extrusion detection of the transform of the skin portion, .i.e., determining whether or not the transform of the skin portion is an extrusion surface, by applying the computer-implemented method for material extrusion detection disclosed in previously-cited European Patent Application No. 21305673.2 to the transform of the skin portion. Additionally or alternatively, the method may process a skin portion based on an extrusion-processing algorithm that may comprise a step of parameterizing the transform of the skin portion, .i.e., determining one or more first distributions of values each of a respective parameter of the transform of the skin portion, by applying the computer-implemented method for parameterization disclosed in previously-cited European Patent Application No. 21305671.6 to the transform of the skin portion.

As discussed above, processing CAD 3D models of mechanical parts, for example for surface (e.g., revolution surface) detection or parameterization, is particularly relevant in the field of manufacturing CAD, that is, for software solutions to assist design processes and manufacturing processes, whereby the objective is to produce a physical product corresponding to a designed CAD 3D model. Within this context, the CAD 3D model represents a manufacturing product, that may be manufactured downstream to its design. The method may thus be part of such a design and/or manufacturing process. The method may for example form or be part of a step of CAD feature obtention within such design and/or manufacturing process, the step of CAD feature obtention including detection of geometries and parameterization of the detected geometries with respective CAD features. For example, the step of CAD feature obtention may be a step of feature-tree construction. Within this step, the method may detect one or more geometries (e.g., a revolution surface) in a CAD model by processing the transform. The method may then further comprise parameterizing the detected geometries (e.g., parametrizing a revolution surface). The parameterization facilitates the manipulation/edition of the CAD model. The step of CAD feature obtention which includes the method may be followed by further design and/or manufacturing steps which use, optionally after a CAD feature obtention step, parameterized and detected geometries, and notably the geometries detected by the method. These further steps may include further design and/or editions actions, tests, simulations and/or manufacturing. The method may in other words be included in a manufacturing CAD process, at a step where the CAD model is adapted for use in subsequent steps of the manufacturing CAD process (e.g., further design/edit actions, tests, simulations and/or manufacturing). The method may be included in many other applications which use the detected CAD features by the method.

The method may thereby lie in the context of obtention of a semantic 3D model, i.e., a feature tree, by processing a raw geometry representation (e.g., a mesh or a point cloud) that involves a particular geometry (e.g., a revolution geometry). The raw geometry may result from an original feature tree, e.g., for visualization and/or analysis purposes, that is no longer available. Being able to reverse (i.e., obtain) the feature tree, allows advanced edition and supports the full range of capabilities offered by manufacturing CAD programs for the extrusion surfaces. Having thus detected and fitted such particular geometries (e.g., revolution geometry), permits the manufacturing of the corresponding part (e.g., a shaft or a groove) via specific industrial processes, e.g., lathe machining.

The method thus improves the processing (e.g., detection, edition, obtention, conversion into CAD feature and/or parametrization) of one or more skin portions in a CAD 3D model, which for example allows to prepare it in view of the manufacturing. In other words, the processed skin portion that the method provides may be edited for manufacturing purposes. For example, the skin portion processed by the method may be edited in view of characteristics of a downstream manufacturing process (e.g., molding, machining, additive manufacturing). This facilitates preparation and/or set up of the manufacturing machine(s) (e.g., a mold, a machining tool, or a 3D printer). Thus, the method improves the manufacturing of a product represented by the CAD model and increases productivity of the manufacturing process.

As previously discussed, the processing of the skin portion may comprise detection of geometries, for example revolution surfaces which enables parameterization of said detected geometries. The method may thereby be used to parameterize the CAD model or at least a part thereof, to obtain a parameterized CAD model or part thereof. By "parameterized", it is meant that the CAD model (or at least a part of the CAD model, e.g., the skin portion) may be fitted with exactly one 3D geometrical object represented by a parametric equation or a parametric function, thus involving one or more parameters. The one or more parameters may take values each in a respective continuous range. A 3D parameterized geometrical object allows an easy manipulation and/or editability and/or efficient storage in memory, as opposed to non-parameterized 3D geometrical objects such as discrete representations (e.g., point clouds, meshes, or voxel representations). For example, the geometry of the skin portion (e.g., a revolution surface) may be fitted with canonical primitives (e.g., parallelepipeds, cylinders, or tori) or parameterized with other adapted geometrical tools, e.g., with non-canonical parameterized surfaces such as NURBS, or parameterized with other parameterization methods, such as the one of the previously-cited European Patent Application No. 21305671.6. Specifically, the method may process a skin portion based on an extrusion-processing algorithm that may comprise a step of parameterizing the transform of the skin portion, .i.e., determining one or more first distributions of values each of a respective parameter of the transform of the skin portion, by applying the computer-implemented method for parameterization disclosed in previously-cited European Patent Application No. 21305671.6 to the transform of the skin portion. In any application of the method, including those discussed hereinafter, the CAD 3D model may be a measured CAD 3D model (i.e., a CAD model obtained from physical measurements on the mechanical part as discussed hereinbelow). In such a case, performing a processing on the CAD 3D model (or a skin portion thereof) allows to process the (raw) measured CAD 3D model and allows to ultimately edit the measured CAD 3D model (e.g., once a geometry is detected). The method may thereby generally be used to process a measured portion of the mechanical part and then for example to edit it into an editable data structure.

The skin portion, e.g., a revolution surface, has a geometry which is coherent from the point of view of the manufacturing. In other words, the corresponding portion of the mechanical part, in the real-world, has a respective geometry requiring or adapted to a respective manufacturing process (e.g., molding, additive manufacturing or machining), for example corresponding to a preferred (e.g., with respect to manufacturing constraints) machining path or preferred (e.g., with respect to manufacturing constraints) characteristics of a mold.

In examples, the mechanical part may be a molded part, and the portion may be manufactured by molding. The skin portion may for example be a revolution surface representing a molded portion of the mechanical part. Thereby processing it may allow to parameterize and/or edit it based on molding requirements (e.g., facilitating withdrawal of the portion from the mold (i.e., the demolding/unmolding)). The method may thereby be included in a manufacturing CAD process of design and/or manufacturing of a molded part, comprising edition steps downstream to the processing (e.g., surface detection and/or parameterization) performed by the method. The edition steps may include the application of CAD operators to the skin portion to meet constraints of the corresponding mold of the downstream molding process, thereby easing the unmolding/demolding/withdrawal of the molded portion. In examples, the CAD operators may comprise one or more draft operators and the edition steps may comprise adding the draft operator(s), for example at the end of the feature-tree of the skin portion, and then applying the draft operator(s) to the skin portion to make it moldable and/or prepare it for molding.

In examples, the mechanical part and the portion thereof may be manufactured by additive manufacturing. The processing of the skin portion allows for example detection or parameterization of the skin portion, which allows edition of the skin portion. The edition may comprise the definition of a printing path along one or more directions of the skin portion, for example along a direction of revolution or a revolution axis when the skin portion is a revolution surface. The definition of the printing path may be based on the parametrization of the skin portion, i.e., once the skin portion is processed (e.g., the printing path may be generated by a CAD/CAM software from the parametric geometry information in the feature tree (e.g., a circular path, or a path along the axis, for a revolution surface)). The method may thereby be included in a manufacturing CAD process of design and/or manufacturing of a mechanical part manufactured by additive manufacturing. The process may include a step of defining a printing path along a direction of the skin portion (e.g., a revolution axis). The process may further include defining a set of up of a 3D printer carrying out the additive manufacturing in accordance with the defined printing path.

In examples, the mechanical part may be a machined part, and the portion may be manufactured by machining (e.g., cutting). The processing of the skin portion allows for example detection or parameterization of the skin portion, which allows edition of the skin portion. The edition may comprise the definition of a path of the machining tool (e.g., cutting tool) along one or more directions of the skin portion, for example along a direction of revolution or a revolution axis when the skin portion is a revolution surface. Such directions may be configured to result in more efficient machining, for example the machining being faster and/or more accurate along these directions. For example, when the skin portion is a revolution surface, the machining tool may be configured to cut material along a revolution axis of the revolution surface (e.g., the tool path may be generated by a CAD/CAM software from the parametric geometry information in the feature tree (e.g., a circular path, or a path along the axis, for a revolution surface)). The method may thereby be included in a manufacturing CAD process of design and/or manufacturing of a mechanical part manufactured by machining. The process may include a step of defining a path of a machining tool based on one or more characteristics of the skin portion (e.g., a revolution axis) obtained by the method. The process may further include defining a set of up of the machining tool carrying out the machining in accordance with the defined path.

Use of the processing method in manufacturing CAD has been discussed. Other applications, which may be in the manufacturing CAD context or in other contexts, are now discussed.

In a first application, a skin portion processed by the method, for example a detected and/or parameterized revolution surface, may be used for B-rep construction. B-rep construction is discussed in references P. Benko et al., "*Algorithm for reverse engineering boundary representation models*", Computer-Aided Design, 33, 2001, pp. 839-851, in A. Tumanin, "*Polygonal Mesh to B-Rep Solid Conversion: Algorithm Details and C++ Code Samples*", posted on Sep. 4, 2019 on the Habr.com website, and in Bénière et al., "Recovering Primitives in 3D CAD meshes", Proceedings of SPIE, 2011, which are all incorporated herein by reference. As known per se B-rep is a collection of connected bounded surface elements (for example under the STEP file format, as widely known). The B-rep construction may comprise fitting surfaces onto a geometry detected and/or parameterized by the method (e.g., a revolution surface), the extrusion processing algorithm enabling such detection and/or parameterization as previously explained, and bound the surfaces (i.e., determine the B-Rep's topological data, that is, the "is bounded by" relationships) using data about the skin portion (e.g., a revolution axis and/or a revolution profile when the skin portion is a revolution surface). According to this first application, the CAD model processing method may be included in a computer-implemented process for converting a CAD 3D model representing a mechanical part into a boundary representation.

In a second application, a skin portion processed by the method may be used for feature-tree construction. This second application comprises using the geometry of the skin portion, as detected and/or parameterized by the extrusion processing algorithm as previously discussed, to construct a feature-tree representation of the CAD 3D model. The feature-tree construction may indeed comprise parameterizing one or more skin portions each as a respective CAD revolution feature, and then add each parameterized skin portion to the feature-tree. The processing method may thus be included in a computer-implemented process for constructing a feature-tree from a CAD 3D model representing a mechanical part. The feature-tree construction process may comprise:

one or more applications of the method, each application yielding a respective processed skin portion (e.g., a detected and/or parameterized revolution);

parameterizing each skin portion processed by the method by the method;

including each parameterized skin portion into the feature-tree of the mechanical part.

In a third application, a skin portion processed by the method is used for re-meshing (e.g., if the provided CAD 3D model is a 3D mesh) or re-sampling (e.g., if the provided CAD 3D model is a 3D point cloud). According to the third application, the skin portion may be parameterized as explained above, and this allows the re-meshing or re-sampling of the CAD 3D model. In examples where the CAD 3D model is a 3D mesh or a 3D point cloud, processing of a skin portion according to the method enables re-meshing and/or re-sampling the skin portion with more precision, thus obtaining a finer mesh or point cloud. This re-meshing/re-sampling may be used to denoise (e.g., removing outlier points, notably for a 3D point cloud, or smoothing the outer surface of the CAD model, notably for a 3D mesh) the CAD 3D model. Additionally or alternatively, it may be used to tessellate efficiently 3D meshes, i.e., to adapt the size of the mesh's faces to the curvature of the corresponding surfaces in order to minimize the number of faces thereby optimizing the mesh's weight (i.e., storage-wise) while ensuring an optimal discretization distance to the exact surfaces. For example, the re-meshing/re-sampling is used to minimize the mesh's weight while ensuring a sufficiently small distance to the exact surface (e.g., in which case the closeness to the surface is seen as a constraint and not something to optimize). The processing method may thus be included in a computer-implemented process for re-meshing (resp. re-sampling) a CAD 3D model that is a 3D mesh (resp. a 3D point cloud) representing a mechanical part.

A skin portion processed by the method (e.g., a detected and/or parameterized revolution surface) may be used in other applications, for example 3D deformation, 3D rendering (geometric/material attributes computation, occlusion culling, shadows determination), 3D animation and/or shape compression. These applications are discussed in reference Kaiser A. et al., "*A survey of Simple Geometric Primitives Detection Methods for Captured 3D data*", Computer Graphics Forum, 2018, which is incorporated herein by reference. Once a skin portion has been processed by the method (e.g., once a revolution surface is detected and/or parametrized), deformations of the skin portion may be obtained more precisely and more easily. In examples where the skin portion is a revolution surface, such deformations may be obtained by moving the axis of revolution and/or deforming the revolution profile curve, thus retaining the revolution surface aspect. Furthermore, a processed skin portion according to the method may be rendered and/or animated more easily and precisely and it takes up less memory space on disk compared to a point cloud or a mesh.

The method generally manipulates modeled objects, such as the CAD 3D model. A modeled object is any object defined by data stored e.g., in the database. By extension, the expression "modeled object" designates the data itself. According to the type of the system, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems.

In the context of CAD, a modeled object may typically be a 3D modeled object or 3D model, e.g., representing a product such as a part or an assembly of parts, or possibly an assembly of products. By "3D modeled object" or "3D model", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e., increases the speed at which designers statistically accomplish their tasks). This speeds up the manufacturing process in the industry, as the design of the products is part of the manufacturing process.

The 3D modeled object or 3D model may represent the geometry of a product to be manufactured in the real world subsequent to the completion of its virtual design with for instance a CAD software solution or CAD system, such as a (e.g., mechanical) part or assembly of parts (or equivalently an assembly of parts, as the assembly of parts may be seen as a part itself from the point of view of the method, or the method may be applied independently to each part of the assembly), or more generally any rigid body assembly (e.g., a mobile mechanism). A CAD software solution allows the design of products in various and unlimited industrial fields, including: aerospace, architecture, construction, consumer goods, high-tech devices, industrial equipment, transportation, marine, and/or offshore oil/gas production or transportation. The 3D modeled object may thus represent an industrial product which may be any mechanical part, such as a part of a terrestrial vehicle (including e.g., car and light truck equipment, racing cars, motorcycles, truck and motor equipment, trucks and buses, trains), a part of an aerial vehicle (including e.g., airframe equipment, aerospace equipment, propulsion equipment, defense products, airline equipment, space equipment), a part of a naval vehicle (including e.g., navy equipment, commercial ships, offshore equipment, yachts and workboats, marine equipment), a general mechanical part (including e.g., industrial manufacturing machinery, heavy mobile machinery or equipment, installed equipment, industrial equipment product, fabricated metal product, tire manufacturing product), an electro-mechanical or electronic part (including e.g., consumer electronics, security and/or control and/or instrumentation products, computing and communication equipment, semiconductors, medical devices and equipment), a consumer good (including e.g., furniture, home and garden products, leisure goods, fashion products, hard goods retailers' products, soft goods retailers' products), a packaging (including e.g., food and beverage and tobacco, beauty and personal care, household product packaging).

The 3D model may form a discrete geometrical representation of a 3D real-world object, e.g., representing an object from the real world such as a mechanical part. The discrete geometrical representation is a data structure which comprises a discrete set of pieces of data. Each piece of data may be equivalently referred to as a discrete element. Each piece of data represents a respective geometrical entity positioned in a 3D space. Each geometrical entity represents a respective location of the 3D object (in other words, a respective portion of material constitutive of a solid represented by the 3D object). The aggregation (i.e., union or juxtaposition) of the geometrical entities represents altogether the 3D object.

The discrete geometrical representation may in examples comprise a number of such pieces of data higher than 100, 1000, or 10000.

The discrete geometrical representation may for example be a 3D point cloud, each geometrical entity being a point. The discrete geometrical representation may alternatively be a 3D mesh, each geometrical entity being a mesh tile or face. The 3D mesh may be regular or irregular (i.e., consisting or not of faces of a same type). The 3D mesh may be a polygonal mesh, for example a triangular mesh. The 3D mesh may be obtained from a 3D point cloud, for example by triangulating the 3D point cloud (e.g., with a Delaunay triangulation).

The 3D point cloud or 3D mesh may be determined from physical measurements on a real object, for example within a reconstruction process. The 3D reconstruction process may comprise providing the real object, providing one or more physical sensors each configured for acquiring a respective physical signal, and acquiring one or more respective physical signals by operating the one or more physical sensors on the real object (i.e., scanning the real object with each sensor). The 3D reconstruction may then automatically determine a 3D point cloud and/or a 3D mesh based on the measurements, according to any known technique. The one or more sensors may comprise a plurality of (e.g., RGB, and/or image or video) cameras and the determination may comprise a structure-from-motion analysis. The one or more sensors may alternatively or additionally comprise one or more depth sensors (e.g., on an RGB-depth camera) and the determination may comprise a 3D reconstruction from depth data. The one or more depth sensors may for example comprise a laser (e.g., a lidar) or an ultrasound emitter-receiver.

The 3D point cloud or 3D mesh may alternatively be obtained from a 3D modeled object representing a skin (i.e., outer surface) of a solid or mechanical part for example by ray casting on the 3D modeled object or tessellating the 3D modeled object. The tessellating may be performed according to any 3D modeled object rendering process. Such a rendering process may be coded on any CAD system in order to display a graphical representation of the 3D modeled object. The 3D modeled object may be designed or have been designed by a user with a CAD system.

A CAD system may be history-based. In this case, a modeled object is further defined by data comprising a history of geometrical features. A modeled object may indeed be designed by a physical person (i.e., the designer/user) using standard modeling features (e.g., extrude, revolute, cut, and/or round) and/or standard surfacing features (e.g., sweep, blend, loft, fill, deform, and/or smoothing). Many CAD systems supporting such modeling functions are history-based systems. This means that the creation history of design features is typically saved through an acyclic data flow linking the said geometrical features together through input and output links. The history of the part is the design intent. Basically, the history gathers the information on the operations which the modeled object has undergone, thereby enabling design changes of the part according to the design intent. The history based modeling paradigm may be realized according to any of known methods in the art.

By PLM system, it is additionally meant any system adapted for the management of a modeled object representing a physical manufactured product (or product to be manufactured). In a PLM system, a modeled object is thus defined by data suitable for the manufacturing of a physical object. These may typically be dimension values and/or tolerance values. For a correct manufacturing of an object, it is indeed better to have such values. For example, a PLM system may manage fabrication tolerances, for example, in machining or molding regarding a provided feature in a CAD model.

By CAM solution, it is additionally meant any solution, software or hardware, adapted for managing the manufacturing data of a product. The manufacturing data generally includes data related to the product to manufacture, the manufacturing process and the required resources. A CAM solution is used to plan and optimize the whole manufacturing process of a product. For instance, it can provide the CAM users with information on the feasibility, the duration of a manufacturing process or the number of resources, such as specific robots, that may be used at a specific step of the manufacturing process; and thus allowing decision on management or required investment. CAM is a subsequent process after a CAD process and potential CAE process. For example, a CAM solution may provide the information regarding machining parameters, or molding parameters coherent with one or more features in a CAD model. Such CAM solutions are provided by Dassault Systèmes under the trademark DELMIA®.

By CAE solution, it is additionally meant any solution, software or hardware, adapted for the analysis of the physical behavior of a modeled object. A well-known and widely used CAE technique is the Finite Element Method (FEM) which typically involves a division of a modeled object into elements which physical behaviors can be computed and simulated through equations. Such CAE solutions are provided by Dassault Systèmes under the trademark SIMULIA®. Another growing CAE technique involves the modeling and analysis of complex systems composed a plurality of components from different fields of physics without CAD geometry data. CAE solutions allow the simulation and thus the optimization, the improvement and the validation of products to manufacture. Such CAE solutions are provided by Dassault Systèmes under the trademark DYMOLA®.

PDM stands for Product Data Management. By PDM solution, it is meant any solution, software or hardware, adapted for managing all types of data related to a particular product. A PDM solution may be used by all actors involved in the lifecycle of a product: primarily engineers but also including project managers, finance people, salespeople and buyers. A PDM solution is generally based on a product-oriented database. It allows the actors to share consistent data on their products and therefore prevents actors from using divergent data. Such PDM solutions are provided by Dassault Systèmes under the trademark ENOVIA®.

The method comprises providing a CAD 3D model of the mechanical part. The CAD 3D model includes a skin portion representing an outer surface of the portion of the mechanical part. The portion of the mechanical part may be a strict portion of the mechanical part, which comprises then other portions. The method processes the skin portion based on an extrusion-processing algorithm. The method may also be iterated, i.e., applied to one or more other portions of the mechanical part, each application of the method to a respective other portion processes the respective skin portion based on an extrusion-processing algorithm. Alternatively, the portion of the mechanical part may be the mechanical part itself. The portion of the mechanical part may be fabricated by a machining process, an additive manufacturing process and/or molding. In examples, the portion of the mechanical part may be a shaft or a groove having a distribution of material arranged as a revolution.

By "outer surface" it is meant a surface in contact with a medium other than the mechanical part, e.g., another mechanical part or air. In other words, the outer surface forms a delimitation between the outside of the mechanical part and the inside of the mechanical part at the portion. By "skin portion", it is meant any surface representation (open surface or closed surface) of the outer surface (or "skin") of the portion of the mechanical part. The skin portion may represent at least a part of a boundary (i.e., surface) of the respective 3D model, said at least a part of the boundary representing the outer surface. In other words, the skin portion is a part of the provided 3D model of the mechanical part corresponding to the outer surface of the mechanical part. In yet other words, while the CAD 3D model altogether represents the mechanical part, the skin portion is a part of the CAD 3D model that represents the outer surface of the portion of the mechanical part. The skin portion may be a strict portion of the boundary of the provided CAD 3D model, in the case where the portion is a strict portion of the mechanical part. The 3D model comprises in this case other portions each representing another respective portion of the mechanical part. Alternatively, the skin portion may be the outer boundary of the CAD 3D model, in the case where the portion is the mechanical part itself.

The method may comprise prior to providing the CAD 3D model, performing a method of segmentation. The method of segmentation may provide one or more segments of the CAD 3D model. The skin portion may comprise or consist of one or more segments of the CAD 3D model obtained in the segmentation process.

As discussed above, the providing of the CAD 3D model may comprise measuring or acquiring the CAD 3D model, e.g., by providing physical sensors and operating them on the mechanical part (e.g., this may for example consist in scanning the mechanical part), and then performing a 3D reconstruction process to obtain the 3D model. Alternatively, the providing of the 3D model may comprise creating the 3D model, e.g., by sketching it. In yet another alternative, the providing of the 3D model may comprise retrieving the 3D model from a (e.g., distant) database on which the 3D model has been stored further to its creation or acquirement.

The method further comprises processing the skin portion based on an extrusion-processing algorithm. As discussed above, the processing of the skin portion may comprise one or more of geometry detection, edition, or parametrization of the skin portion. A transform of the skin portion which representing an unfolding of the distribution of material of the portion is inputted to the extrusion-processing algorithm. By "the transform representing an unfolding of the distribution of material of the portion" it is meant that a respective distribution of material of the transform of the portion is an unfolding of the distribution of material of the portion. By "unfolding of the distribution of material of the portion" it is meant that the distribution of material of the portion is substantially flattened in one direction. In examples where the skin portion is a revolution surface, i.e., formed by revolving a profile around a revolution axis, the unfolding may be represented as flattening the skin portion along a path of revolving of the profile. In other words, the direction of the flattening is the extrusion direction of the transform of the skin portion (noting that the transform of a revolution is an extrusion). In examples, the unfolding of the skin portion may be a flat surface, for example if (and only if) the profile of the revolution surface is a line; the unfolding produces a flat surface (i.e., a plane).

Figure 2:
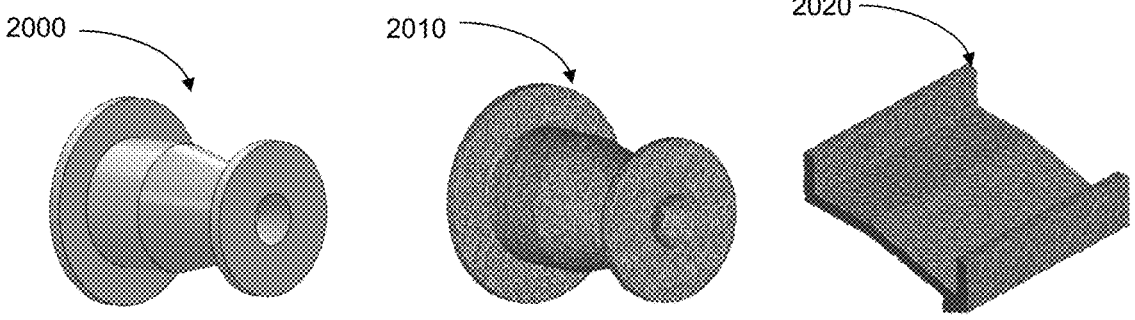
Figure 4:
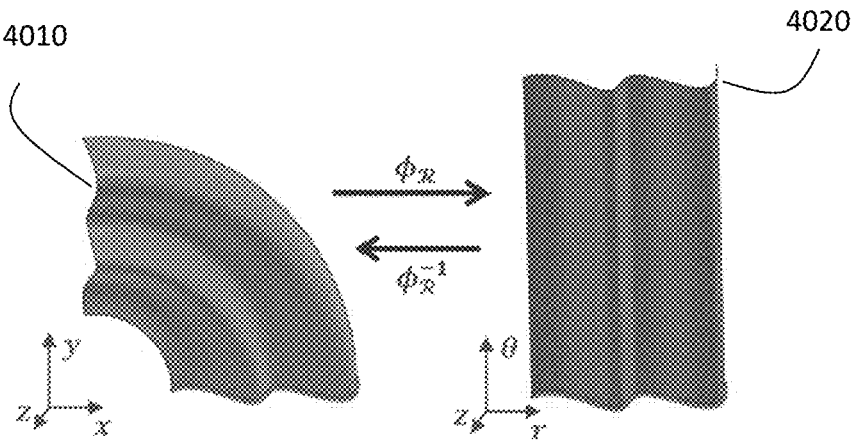

FIGS. 1, 2, and 4 illustrate such a transform. As illustrated in FIG. 1, an unfolding of the portion 1000 with skin portions 1010 and 1020 results in the transforms 1030 and 1040 of the skin portions 1010 and 1020, respectively, which are substantially flattened. Similarly, as illustrated in FIG. 2, an unfolding of the portion 2000 with skin a portion 2010 results in the transforms 2020. As illustrated in FIG. 4, the skin portion 4010 is flattened along a revolving path (in x-y plane) to obtain the transform 4020.

The method may comprise a step of computing of an unfolding the distribution of material the portion, i.e., of computing of a transform of the skin portion thereof prior to process the skin portion. Alternatively, the algorithm may not require any effective computation of the transform but may be carried out by integrating the unfolding in the processing of the skin portion, for example by processing the skin portion in a coordinate system corresponding to the application of the transform. By "processing the skin portion based on an extrusion-processing algorithm" it is meant processing the skin portion using an extrusion-processing algorithm. The extrusion-processing algorithm may be any algorithm for processing extrusion-related characteristics of an input to the algorithm, for example an algorithm to detect extrusion surfaces of the input and/or an algorithm to parametrize (for example the detected) extrusion surfaces of the input. Thus, the method processes the skin portion by processing its respective transform, e.g., the method processes a revolution surface by processing an extrusion surface which is the transform of the revolution surface.

In examples, the extrusion-processing algorithm may comprise an algorithm to detect extrusion surfaces according to the previously-cited European Patent Application EP21305673.2. Specifically, the extrusion-processing algorithm may comprise a step of material extrusion detection of the transform of the skin portion, .i.e., determining whether or not the transform of the skin portion is an extrusion surface, by applying the computer-implemented method for material extrusion detection disclosed in previously-cited European Patent Application No. 21305673.2 to the trans-form of the skin portion. Alternatively or additionally, the extrusion-processing algorithm may comprise an algorithm to parametrize extrusion surfaces according to the previously-cited European Patent Application No. 21305671.6. Specifically, the extrusion-processing algorithm may comprise a step of parameterizing the transform of the skin portion, .i.e., determining one or more first distributions of values each of a respective parameter of the transform of the skin portion, by applying the computer-implemented method for parameterization disclosed in previously-cited European Patent Application No. 21305671.6 to the trans-form of the skin portion.

The processing of the skin portion based on an extrusion-processing algorithm may comprise unfolding the skin portion. The unfolding of the skin portion obtains the transform of the skin portion (i.e., the unfolding takes as input the skin portion and outputs the transform), thus preparing it to be inputted to the extrusion-processing algorithm. The processing may further comprise inputting the transform to the extrusion-processing algorithm and then running the extrusion-processing algorithm. The running of the extrusion-processing algorithm may be started by inputting the transform to the algorithm.

According to a first aspect, the extrusion-processing algorithm may comprise determining whether or not the transform of the skin portion represents an outer surface of a distribution of material arranged as an extrusion. The determining whether or not the transform of the skin portion is arranged as an extrusion may be equivalently referred to as an extrusion detection. The extrusion detection may comprise determining an extrusion direction for the transform of the skin portion. Alternatively, the extrusion detection may comprise providing a potential extrusion direction, for example by a user, along which the method verifies if the material distribution is arranged as an extrusion. The extrusion detection may be according to the previously-cited European Patent Application EP21305673.2. Specifically, the extrusion-processing algorithm may comprise a step of material extrusion detection of the transform of the skin portion, .i.e., determining whether or not the transform of the skin portion is an extrusion surface, by applying the computer-implemented method for material extrusion detection disclosed in previously-cited European Patent Application No. 21305673.2 to the transform of the skin portion.

Such an extrusion detection on the transform of the skin portion may detect a respective property of the skin portion. In examples wherein the distribution of material is arranged as a revolution, the extrusion detection of the transform of the skin portion may determine whether or not the skin portion represents an outer surface of a distribution of material arranged as a revolution, i.e., a revolution surface. In such examples, the skin portion is determined by the method to be a revolution surface when the transform of the skin portion is determined to be an extrusion surface. Optionally, the extrusion detection may comprise determining a revolution axis for the determined revolution surface. Alternatively, the extrusion detection may comprise providing a potential revolution axis, for example by a user, along which the method verifies if the material distribution is arranged as a revolution. If the skin portion is a revolution, the transform of the skin portion is an extrusion having an extrusion direction that corresponds to the revolution direction around the revolution axis, i.e., along circles around the revolution axis or equivalently corresponding to a family of vectors orthogonal to the revolution axis (and tangent to the circles). The extrusion direction may be orthogonal to the revolution axis of the skin portion.

The extrusion-processing algorithm may further comprise computing an extrusion profile. The extrusion profile may be an extrusion profile of the transform of the skin portion. In examples wherein the distribution of material is a revolution, the computing of an extrusion profile computes a profile of the revolution surface. The computing of an extrusion profile may be based on the determined extrusion direction or based on a provided extrusion direction. The extrusion-processing algorithm may compute an extrusion profile according to any known method for computing an extrusion profile with a respective given extrusion direction, for example according to already cited European Patent Applications No. 21305673.2 or No. 21305671.6. Specifically, the extrusion-processing algorithm may comprise a step of parameterizing the transform of the skin portion, determining one or more first distributions of values each of a respective parameter of the transform of the skin portion, by applying the computer-implemented method for parameterization disclosed in previously-cited European Patent Application No. 21305671.6 to the transform of the skin portion. The application of this parameterization method may comprise a step of computing a profile, which may include fitting one or more curves, based on each determined distribution of values as disclosed in previously-cited European Patent Application No. 21305671.6. Additionally or alternatively, the extrusion-processing algorithm may comprise a step of material extrusion detection of the transform of the skin portion, .i.e., determining whether or not the transform of the skin portion is an extrusion surface, by applying the computer-implemented method for material extrusion detection disclosed in previously-cited European Patent Application No. 21305673.2 to the transform of the skin portion. The application of this method of material extrusion detection may comprise a step of computing a profile, which may include fitting one or more curves, based on the provided or determined extrusion direction as disclosed in previously-cited European Patent Application No. 21305673.2.

According to a second aspect, which is combinable with the first aspect, the processing of the skin portion based on an extrusion-processing algorithm may comprise a material revolution detection in the portion of the mechanical part. The material revolution detection may comprise determining a revolution axis by optimizing an objective function penalizing non-orthogonality of a normal of the skin portion to a rotation direction orthogonal to a candidate revolution axis to an extent which is increasingly proportional to a distance to the revolution axis. According to the second aspect, the optimizing of the objective function may be directly applied on the skin portion without using the transform of the skin portion.

In other words and according to the second aspect, the method is a method of revolution detection in a portion of a mechanical part including a portion having a distribution of material, and the application of the extrusion processing algorithm forms a step of determining whether or not the distribution of material is arranged as a revolution. In yet other words and according to the second aspect, it is further proposed a computer-implemented method for revolution detection in a portion of a mechanical part having a distribution of material, the method comprising:

providing a CAD 3D model of the mechanical part, the 3D model including a skin portion of the 3D model representing an outer surface of the portion of the mechanical part; and determining whether or not the distribution of material is arranged as a revolution, including determining a revolution axis by optimizing an objective function penalizing non-orthogonality of a normal of the skin portion to a rotation direction orthogonal to a candidate revolution axis to an extent which is increasingly proportional to a distance to the revolution axis.

In examples according to a combination of the first and second aspects, the processing of the skin portion is based on a first extrusion-processing algorithm according to the second aspect and further based on another (i.e., a second) extrusion-processing algorithm according to the first aspect. In such examples, the method first processes the skin portion based on the first extrusion-processing algorithm, and then processes the skin portion based on the second extrusion process algorithm. In such a case, the method first applies the first extrusion-processing algorithm (i.e., according to the second aspect), which outputs a revolution axis for the skin portion. Then, the method computes the transform of the skin portion based on the revolution axis, which results in an extrusion having an extrusion direction corresponding to the revolution direction around the revolution axis, i.e., along circles around the revolution axis or equivalently corresponding to a family of vectors orthogonal to the revolution axis (and tangent to the circles). The extrusion direction may be orthogonal to the revolution axis. Then, the method applies the second extrusion-processing algorithm (i.e., according to the first aspect) to the computed transform. In other words, such examples allow to detect a revolution axis so as to define the transform to then apply the second algorithm, which amounts to preparing the skin portion to the application of the second algorithm. Additionally or alternatively, since the first algorithm determines a revolution axis, the first algorithm already provides a detection of whether or not the skin surface is a revolution. In this case, the second algorithm may be an extrusion-detection algorithm which determines whether or not the transform is an extrusion, thereby performing an indirect revolution detection for the skin portion as previously explained. In other words, this case of combination of the first and second aspect provides a double revolution detection, i.e., a double-check that the skin portion is a revolution.

As discussed above the objective function penalizes non-orthogonality of a normal of the skin portion to a rotation direction orthogonal to a candidate revolution axis (i.e., the free variable of the optimization). Thereby, optimizing the objective function is minimizing the objective function. The rotation direction is a direction representing a rotation around the candidate revolution axis. The rotation direction is defined in a plane orthogonal to the revolution axis. The penalization is to an extent where the objective function is increasingly proportional to a distance to the revolution axis. This objective function may correspond to an objective function for extrusion detection expressed in another coordinate system that result from the transform, such that, the transform of the revolution being an extrusion, the optimization of the objective function results in the determining of the revolution axis for the skin portion. In particular, for a skin portion arranged as a revolution, the normal to the skin portion is orthogonal to the revolution direction, i.e., the direction of revolving a profile of the revolution surface around the revolution axis. Thus, minimizing the non-orthogonality of the normal to the skin portion to the rotation direction results in obtention of the revolution axis. The penalizing comprises a constant weight for each location regardless of its distance to the axis. This improves the method for the examples where the 3D model is 3D mesh or a 3D point cloud with general density of points (i.e., vertices of the mesh or points of the point cloud are not necessarily uniformly distributed in a 3D space) as for a same level of noise in the 3D model (i.e., among points of the point cloud or vertices of the mesh), the penalization penalizes all equally and does not favor points further away from the axis. This is in particular improves the processing when the 3D model is a result of a general CAD software where the number of points is approximately the same at any distance from the axis, but the distance between the points (and thus the size and area of the faces of a mesh, for example triangles or quads) grows proportionally with the distance.

The objective function may be of the type:

$$J_R(u, c) = \frac{1}{\mathcal{A}_S} \int_S \frac{1}{|p - \pi_{c,u}(p)|} (u \times (p - c) \cdot n)^2 dvol_S,$$

where u is a direction of the candidate revolution axis, c is an origin of the candidate revolution axis, $\mathcal{A}_S$ is an area of the skin portion, S is the skin portion, p is a position on the skin portion, $\pi_{c,u}(p)$ is an orthogonal projection of p on the candidate revolution axis, and n is a normal to the skin portion at position p. The optimizing of the objective function $J$ is a nonlinear optimization problem. The method may solve this non-linear optimization problem by first fixing the weights $$\frac{1}{|p_\tau - \pi_{c,u}(p_\tau)|}$$

to a constant value (e.g., 1) and solving the problem via a least squares method in order to obtain an initial solution for u and c. The method may then inject this initial solution (e.g., as an initial guess) into a non-linear optimization solver, e.g., using a Levenberg-Marquardt algorithm to solve the nonlinear optimization problem. This improves the optimizing of the objective function to solve it more computationally efficiently and without obtaining local minima of the objective function (i.e., as result of the optimization), by using a good initial solution in the optimization solver.

Figure 3:
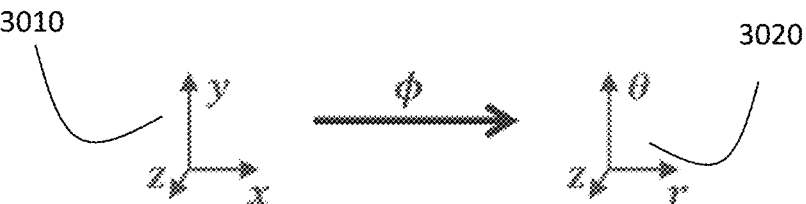

In reference to FIGS. 3 and 4, the unfolding may comprise providing a revolution axis. In examples according to the second aspect (or the combination of the first and the second aspects) discussed above, the provided revolution axis may be a determined revolution axis by optimizing an objective function as discussed above. The revolution axis may be independently provided by a user. The unfolding may further comprise determining a cylindrical coordinate specification of the skin portion. The cylindrical coordinate specification may include first values. The first values may form a set of triplet coordinate values. Each of the triplet coordinate values specifies a respective position on the skin portion relative to a cylindrical coordinate system. The cylindrical coordinate system may have a longitudinal axis that is the provided revolution axis. For example, the cylindrical coordinate system may be the cylindrical representation of the Cartesian coordinate system 3010 in which the longitudinal axis z is the revolution axis of the skin portion 4010. The unfolding may further comprise determining a Cartesian coordinate specification of the transform relative to a Cartesian coordinate system having one axis which is the longitudinal axis. For example, the unfolding of FIGS. 3 and 4 determines the Cartesian coordinate specification 3020 of the transform relative to a Cartesian coordinate system 3010 having one axis which is the longitudinal axis z. The Cartesian coordinate specifications may include second values specifying positions on the transform. The second values may correspond (e.g., may be equal) to the first values. In other words, the Cartesian coordinate specification 3020 represents values of the cylindrical coordinate system representing of Cartesian coordinate system 3010 as a Cartesian coordinate system. In examples, the determining of a cylindrical coordinate specification of the skin portion is based on a reference (global) Cartesian coordinate system. This constitutes an equivalence between a revolution surface and an extrusion surface, thereby enables the processing method to employ extrusion processing techniques known in the art. In reference to FIG. 3, the second values may be triplet of (r, θ, z) with respect to the Cartesian coordinate system 3020. The second values represent a radial distance, an angular position and a longitudinal position. The value of r may be set to a reference value, for example, the unity. The value of θ may be in an interval (e.g., [0, 2π], or [−π, π]). The value of z may belong to an interval, for example [0, L]. FIG. 4 illustrates the equivalence between a revolution surface 4010 and an extrusion surface 4020 with respect to the unfolding transform $\Phi_R$ and its inverse $\Phi_R^{-1}$.

In examples, the skin portion may be represented by a 3D discrete geometrical representation having discrete elements. In such examples, the determining of the cylindrical coordinate specification of the skin portion comprises determining the first values for each discrete element of the 3D discrete geometrical representation. The first values of the cylindrical coordinate specification may consist of, for each discrete element, values of a radial distance being a norm of a radial vector with respect to the longitudinal axis, an angular position on the skin portion with respect to a radial vector and the longitudinal axis, and a longitudinal position. The radial vector may be a vector connecting the center (i.e., origin) of the Cartesian coordinate system to a position of the discrete element. The longitudinal position may designate a position on the longitudinal axis. The longitudinal position may be a projection to the longitudinal axis. The projection to the longitudinal axis may be an orthogonal projection to the axis. The radial distance may be equivalently referred to as radius. The angular position may be equivalently referred to as azimuth. The radius, the azimuth and the longitudinal position may be defined as known in standard cylindrical coordinate system.

The determining of the cylindrical coordinate specification may comprise computing the values of the angular position by exploring discrete elements of the 3D discrete geometrical representation. For each explored discrete element, the method may compute the angular positions of neighboring discrete elements of the explored discrete element. In other words, the method may explore the discrete elements by starting from one or more discrete elements and exploring the respective neighbors. By "neighboring discrete elements of a discrete element" it is meant a set of discrete elements geometrically positioned (in a 3D space) in a proximity of the discrete element, for example in a sphere of a predefined radius. In examples where the discrete geometrical representation is a mesh, the neighboring discrete elements of a discrete element, i.e., a vertex of the mesh, may be adjacent vertices, i.e., vertices connected by an edge of the mesh to the vertex. In examples, the computing of the angular positions may start by selecting randomly a discrete element not being geometrically positioned on the revolution axis. The computing may continue by computing the angular position of each of the neighbors of the discrete element. The computing may further continue by computing the angular position of each of the neighbors of discrete elements with already computed angular position till computing the angular position for all the discrete elements. Such an exploration may be equivalently referred to as propagation. Using the propagation improves the determining of the cylindrical coordinate specification as computing the angular position independently for each discrete element may result to obtain two disjointed intervals for value of angular positions thus resulting in two disjointed surfaces, whereas the propagation avoids this.

Figure 5:
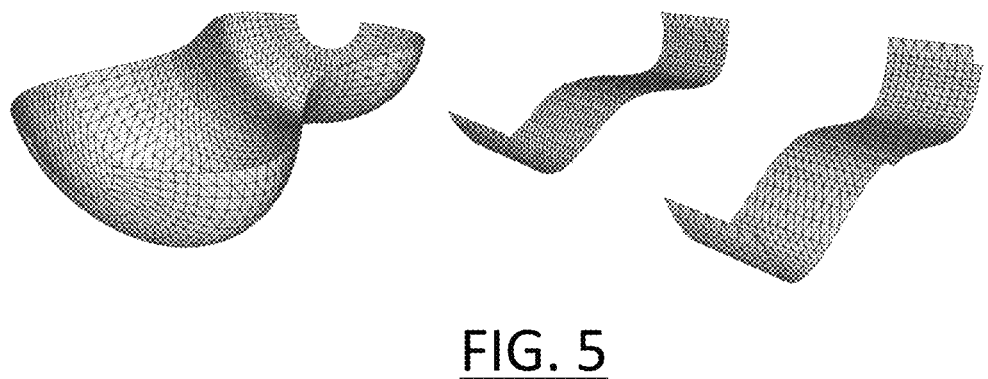
Figure 6:
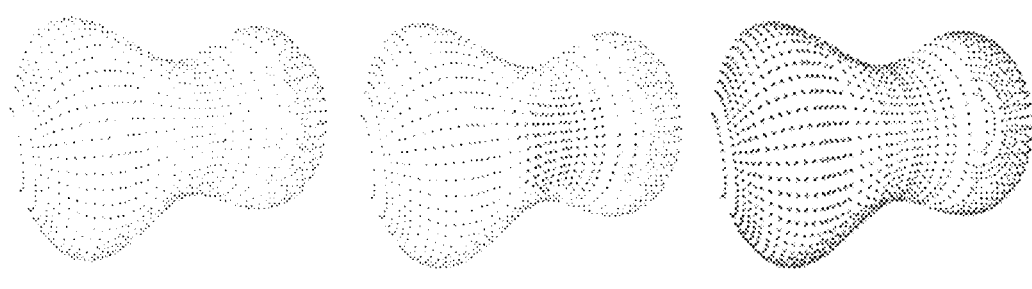
Figure 7:
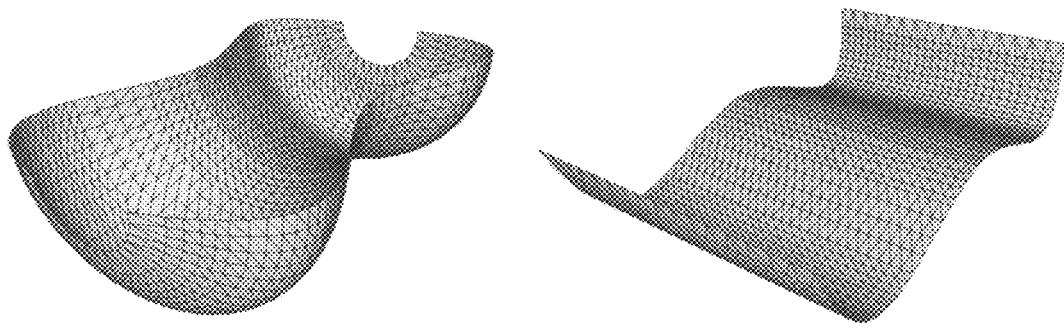

An example of the determining of the cylindrical coordinate specification by exploring discrete elements is illustrated in FIGS. 5 to 7. The independent computation of the angular position results in the disjointed surfaces of FIG. 5. The method may use the propagation illustrated in FIG. 6, while propagation computes the angular position in a growing pattern from left to right of FIG. 6, results in jointed surfaces of FIG. 7. In cases where the discrete geometrical representation is a mesh, the method may explore the discrete elements along faces/elements of the mesh (e.g., triangles) rather than along the vertices of the mesh, and compute angular values for the face/element barycenters. In examples where the discrete geometrical representation is a point cloud, the method may explore the points of the point cloud from one point to another using a distance proximity condition (e.g., in a sphere of a predefined radius as discussed above). This ensures that the resulting unfolded mesh is connected.

Figure 8:
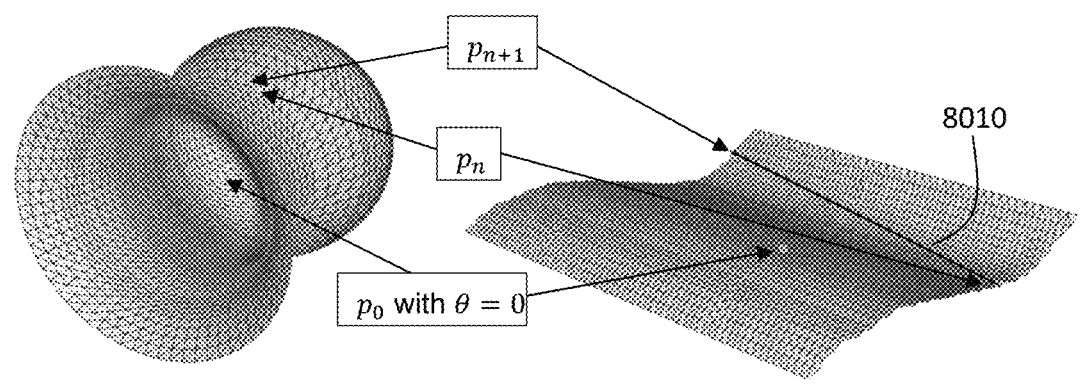

The computing of the values of the angular position of neighboring discrete elements of the explored discrete element may comprise duplicating one or more of the neighboring discrete elements for which the difference with the angular position of the explored discrete element is larger than a threshold. In examples, the threshold may be equal or larger than $\pi$. In examples where the 3D model is a 3D mesh, the duplicating comprises duplicating one of the two vertices of one or more edges of the mesh. This improves the computing of angular positions for when the skin portion is a full revolution surface. By a "full revolution surface" it is meant a surface that is closed in the revolution direction. A full revolution surface may be equivalently referred to as a complete revolution surface or a total revolution surface. In other words, a full revolution surface is a surface obtained by rotating a profile curve on a full circle, i.e., 360 degrees, around an axis (of revolution). FIG. 8 illustrates an example of a full revolution surface that is closed in the revolution direction but is open at both ends (in the axis direction), i.e., it has two circular boundaries (each generated by rotating the profile's extremity points around the revolution axis). In such cases the propagation may be interrupted when the exploring of the discrete elements explored discrete elements with an already computed value for the angular position during the exploration. The duplicating of one or more of the neighboring discrete elements for which the difference with the angular position of the explored discrete element is larger than the threshold ensures the coherence of the values of the angular positions, i.e., avoiding jumps in the values of the angular positions due to a full rotation. Obtention of disjointed surfaces is also avoided, as they could have occurred by only using cuts instead of duplicating the faces/polygons at the jump locations.

The values of the angular position may be of the type $$e_i = \frac{p_i - (p_i \cdot u)u}{|p_i - (p_i \cdot u)u|}$$

$$\cos(\theta_{i+1} - \theta_i) = e_i \cdot e_{i+1}$$

$$\sin(\theta_{i+1} - \theta_i) = (e_i \times e_{i+1}) \cdot u,$$

where u is the longitudinal axis, $p_i$ is a cartesian position vector of an explored discrete element i, $\theta_i$ is a value of the angular position for the explored discrete element, $\theta_{i+1}$ is a value of the angular position of a neighbor i+1 of the explored discrete element i.

The method may further comprise scaling the values of the angular position. The scaling may scale the values of the angular position of the transform of the skin portion to avoid very short or very long extrusions, depending on the extension of the surface along the r- and z-axis.

The methods are computer-implemented. This means that steps (or substantially all the steps) of the methods are executed by at least one computer, or any system alike. Thus, steps of the methods are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined.

For instance, the step of providing a CAD 3D model of the mechanical part may be triggered upon an action of the user. For example, the action may comprise importing, loading, or creating the CAD 3D model by the user.

A typical example of computer-implementation of a method is to perform the method with a system adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (e.g., one for the program, and possibly one for the database).

Figure 11:
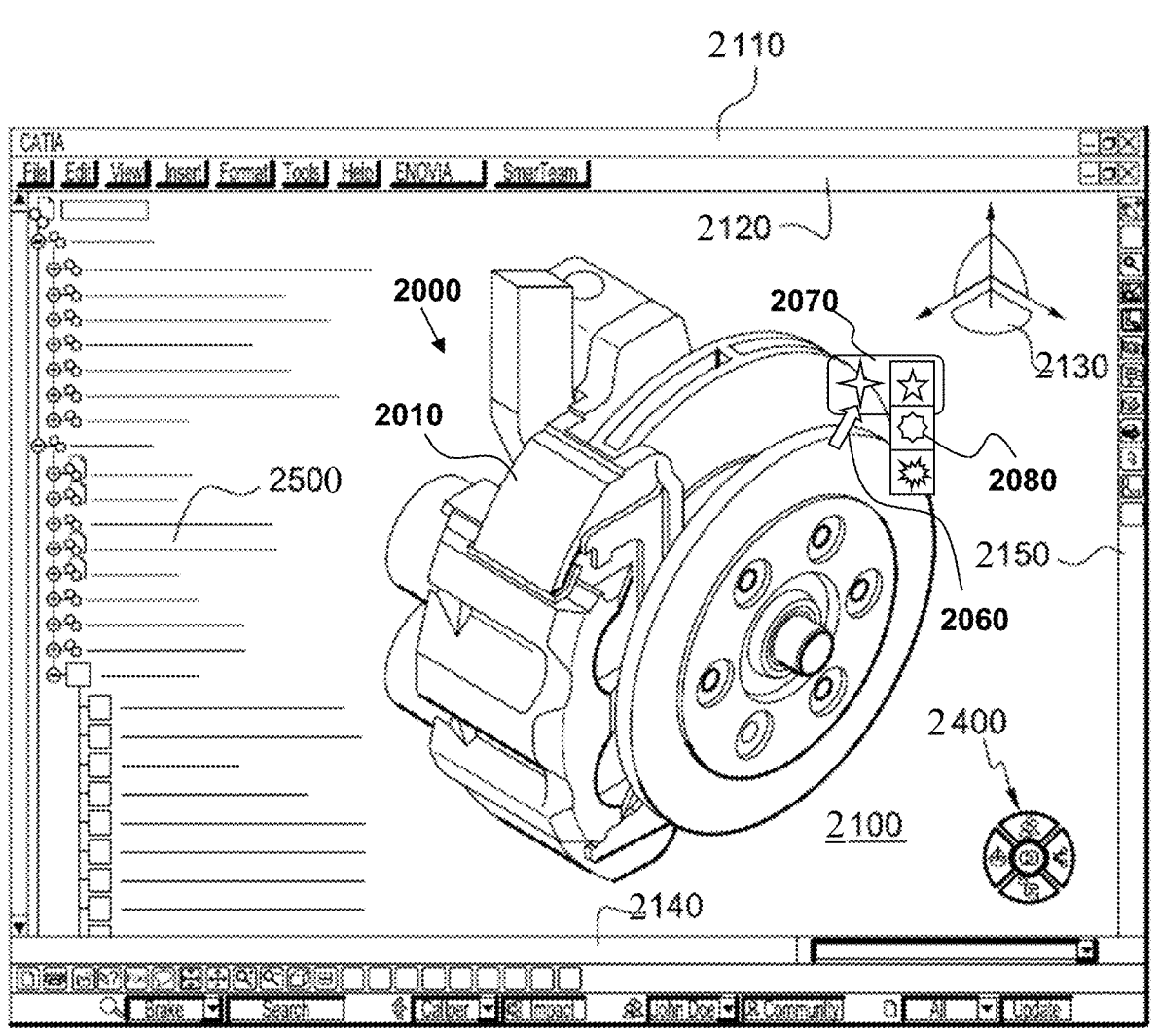
FIG. 11 shows an example of a graphical user interface of the system.

FIG. 11 shows an example of the GUI of the system, wherein the system is a CAD system. The model 2000 is an example of the CAD 3D model provided to the method. The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g., change the dimension, color, etc.) or edit geometrical constraints by selecting an appropriate icon. For example, typical CAD operations are the modeling of the punching or the folding of the 3D modeled object displayed on the screen. The GUI may for example display data 2500 related to the displayed product 2000. In the example of the figure, the data 2500, displayed as a "feature-tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 12:
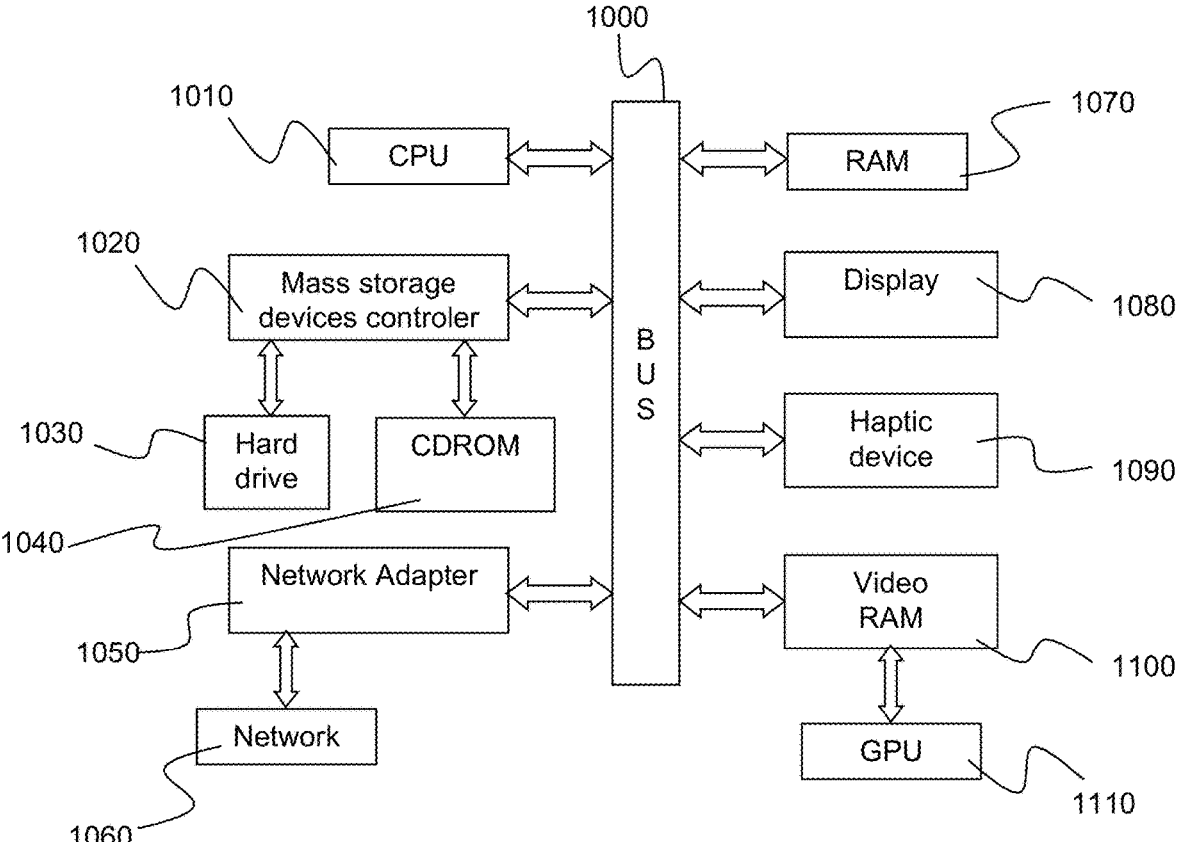
FIG. 12 shows an example of the system.

FIG. 12 shows an example of the system, wherein the system is a client computer system, e.g., a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the methods. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

Implementations of the method are now discussed.

The implementations lie in the context of obtention of a semantic 3D model (i.e., a feature tree) from processing a raw geometry representation (e.g., a mesh or a point cloud) that involves revolution geometry. The raw geometry may result from an original feature tree, e.g., for visualization and/or analysis purposes, that is no longer available. Being able to reverse (i.e., obtain) the feature tree, allows advanced edition and supports the full range of features offered by traditional CAD programs, and in this case all the functionalities available for a revolution geometry as a shaft or a groove. Having thus detected and fitted such revolution features on the geometry, permits the manufacturing of the corresponding part via specific industrial processes, e.g., lathe machining. To achieve this, the implementations determine the mathematical description of a surface of revolution that best fits a mesh or a point cloud. In the case of a point cloud, the implementations require, for each point of the point cloud, both the normal vector, as well as the nearest points in the neighborhood (thus providing a minimal topological information).

The implementations detect a revolution surface by considering the revolution in Cartesian coordinates as an extrusion surface in a cylindrical coordinate system. As illustrated in FIG. 3, the following transformation $\Phi$ in 3D space converts Cartesian coordinates to cylindrical coordinates:

$$\Phi; \begin{vmatrix} \mathbb{R}^3 \to \mathbb{R}_+ \times [-\pi, \pi[ \times \mathbb{R} \\ \begin{pmatrix} x \\ y \\ z \end{pmatrix} \mapsto \begin{pmatrix} r(x,y) \\ \theta(x,y) \\ z \end{pmatrix} \end{vmatrix}$$

As illustrated in FIG. 4, the implementations may transform a revolution surface, with an axis defined by a point c and a vector $u_R$, into an extrusion surface using the same profile of the revolution surface. The transform combines a translation (from c to the origin), a rotation R (that rotates $u_R$ to the z-axis) and the transform $\Phi$ into a transformation $\Phi_R(x)=\Phi(R(x-c))$. This amounts to unfold the surface of revolution into an extrusion surface. The profile curve is not modified or deformed since the transformation does not affect any of the points located in the xz-plane (which transformed into the rz-plane).

The implementations take advantage of the equivalence between surfaces of revolution and extrusion surfaces that makes it possible to re-use an existing solution for extrusion surfaces, and thus simplify the problem. The implementations exploit all available geometric data of the 3D CAD model, thus require a small amount of computation. The provides a generic solution (all possible types of surfaces of revolution) and supports noisy input. The resulting solution is better suited to various types of input, e.g., non-uniform meshes. In addition, the implementations enable application methods of detecting and fitting extrusion surfaces according to previously-cited European Patent Applications No. 21305673.2 and No. 21305671.6, i.e., Monte-Carlo shadow estimation to avoid false extrusion positives, natural surface parameterization, and profile computation. Specifically, the implementation may process a skin portion based on an extrusion-processing algorithm comprising a step of material extrusion detection of the transform of the skin portion, .i.e., determining whether or not the transform of the skin portion is an extrusion surface using the Monte-Carlo shadow estimation to avoid false extrusion positives by applying the computer-implemented method for material extrusion detection disclosed in previously-cited European Patent Application No. 21305673.2 to the transform of the skin portion. The application of this method of material extrusion detection may comprise a step of computing a profile, which may include fitting one or more curves, based on the provided or determined extrusion direction as disclosed in previously-cited European Patent Application No. 21305673.2. Additionally or alternatively, the method may process a skin portion based on an extrusion-processing algorithm may comprise a step of parameterizing the transform of the skin portion for a natural surface parameterization, .i.e., determining one or more first distributions of values each of a respective parameter of the transform of the skin portion by applying the computer-implemented method for parameterization disclosed in previously-cited European Patent Application No. 21305671.6 to the transform of the skin portion. The application of this parameterization method may comprise a step of computing a profile, which may include fitting one or more curves, based on each determined distribution of values as disclosed in previously-cited European Patent Application No. 21305671.6. The implementations further exploit all available geometric input data while requiring a small amount of computations and provide a generic solution for all possible types of surfaces of revolution. The implementations are also robust to noisy input.

The 3D model provided to the implementations may in particular, comprises data points (e.g., vertices of a mesh or point of a point cloud), normals, and neighborhood information for each point (i.e., the neighboring points). Thus the implementations work with meshes and point clouds where for example provided normal vectors and neighborhood data have been computed beforehand. The implementations may output a revolution axis and a planar profile curve that define the surface of revolution. Limit angles of the surface of revolution may also be computed.

Energy for the Revolution Detection

The implementations compute the revolution axis by optimizing an objective function. The objective function penalizes non-orthogonality of a normal of the skin portion to a rotation direction orthogonal to a candidate revolution axis to an extent which is increasingly proportional to a distance to the revolution axis. Such a penalization forms an energy. Now examples of obtaining such an energy are discussed.

The implementations may compute the revolution axis starting from an extrusion detection energy $$\mathcal{J}_E(u) = \tfrac{1}{\mathcal{A}_s}\int_S |n \cdot u|^2 dvol_S$$

where u is the extrusion direction, n the local normal to the surface S and $\mathcal{A}_S$ the total area of the surface S. The extrusion direction may be obtained by minimizing the value of the extrusion detection energy $\mathcal{J}_E$ with the constraints that the extrusion detection energy is smaller than an extrusion threshold. Then, the revolution detection energy may be derived as $$\mathcal{J}_R(u, c) = \tfrac{1}{\mathcal{A}_s}\int_S \frac{1}{|p - \pi_{c,u}(p)|}(u \times (p - c)\cdot n)^2 dvol_S$$

where the variables u and c are respectively the direction and origin point of the axis of revolution, p is the local point on the surface S, and $\pi_{c,u}(p)$ is the projection of p on the axis.

As previously discussed, the implementations may comprise detection an extrusion surface according to the method of the cited European Patent Application No. 21305673.2. Such an extrusion detection may use an extrusion detection function as $\mathcal{J}_E$. Both of extrusion detection energy $\mathcal{J}_E$ and revolution detection energy $\mathcal{J}_E$ measure the average value of the cosine function (which represents an angle) between a normal to the surface and the extrusion direction or revolution axis, respectively. For an exact extrusion/revolution surface the normal to the surface is orthogonal to the extrusion direction or the revolution axis, respectively. Thus, in theory the value of the energy function ($\mathcal{J}_E$/$\mathcal{J}_R$) tends to be zero when u is the extrusion direction or the revolution axis of the (extrusion/revolution) surface S. In practice, the extrusion detection method and the revolution detection method may determine the extrusion direction or revolution axis when the value of the energy function is below a threshold. The threshold may be in accordance with the level of noise in the inputted 3D CAD model such that the value of the threshold is larger when the 3D model has larger noise. In practice, the threshold may be in an interval of ]0.0, 0.05], or in particular around 0.005 when there is no noise in the 3D model. The threshold for the revolution detection method may be in general set to a higher value than the extrusion detection method as the noise in the 3D model has more impact in the revolution energy.

In order to obtain $\mathcal{J}_R$, denoting $\Pi_- = \mathbb{R}_- \times \{0\} \times \mathbb{R}$ the implementations define the map of cylindrical coordinates:

$$\xi: \begin{vmatrix} \mathbb{R}^3 \backslash \Pi_- \to \mathbb{R}_+^* \times ] - \pi, \pi[ \times \mathbb{R} \\ (x, y, z) \mapsto (r(x, y), \theta(x, y), z) \end{vmatrix}$$

where:

-continued $$r(x, y) = \sqrt{x^2 + y^2}$$

$$\theta(x, y) = sgn(y).\arccos\left(\frac{x}{r(x, y)}\right)$$

and $\xi$ is a $\mathcal{J}^1$-diffeomorphism. The implementations further define two metric tensors g and $\tilde{g}$ on $M = \mathbb{R}^3 \backslash \Pi_-$ by their components in the chart $(M, \xi)$:

$$[g_\xi] = \begin{pmatrix} 1 & 0 & 0 \\ 0 & r^2 & 0 \\ 0 & 0 & 1 \end{pmatrix}, [\tilde{g}_\xi] = \begin{pmatrix} 1 & 0 & 0 \\ 0 & r_0^2 & 0 \\ 0 & 0 & 1 \end{pmatrix}$$

for some constant $r_0 > 0$ and as well as the associated volume forms on M:

$$\omega = \underbrace{\sqrt{\det g_\xi}}_{r} \cdot dr \wedge d\theta \wedge dz, \tilde{\omega} = \underbrace{\sqrt{\det \tilde{g}_\xi}}_{r_0} \cdot dr \wedge d\theta \wedge dz \text{ meaning that} = \frac{r}{r_0}\tilde{\omega}.$$

Given $S \subset M$ be a Riemannian surface and i as the inclusion map, the implementations define the pull-back $i^*T$, where T is a tensor field of type (0, s) on M, as:

$$i^*T:(X_1, \ldots, X_s) \longmapsto T(di(X_1), \ldots, di(X_s))$$

where di may be dropped in notation as di(X) can easily be identified with X.

Then the implementations have induced metric tensors $\sigma = i^*g$ and $\tilde{\sigma}'' = i^*\tilde{g}$ on S, as well as the induced volume forms: $\eta = \sqrt{\det \sigma_x} \cdot dx^1 \wedge dx^2 = i^*Int_n(\omega)$, $\tilde{\eta} = \sqrt{\det \sigma_x} \cdot dx^1 \wedge dx^2 = i^*Int_{\tilde{n}}(\tilde{\omega})$ where $\sqrt{\det \sigma_x} \cdot dx^1 \wedge dx^2$ $\sqrt{\det \sigma_x} \cdot dx^1 \wedge dx^2$ are in a chart (U,x) of S.

where $Int_x(\alpha) \in \Omega^{k-1}(M)$ is the interior product of the $\alpha \in \neq^k (M)$ with the vector field X:

$$Int_x(\alpha)(Y_1, \ldots, Y_{k-1}) = \alpha(X, Y_1, \ldots, Y_{k-1})$$

and n (resp. ñ) is one of the two smooth vector fields on S satisfying:

$\forall X \in \Gamma(TS)$, g(n,X)=0 (resp. $\tilde{g}(\tilde{n}, X)=0$)

g(n, n)=1 (resp. $\tilde{g}(\tilde{n}, \tilde{n})=1$)

which is called the normal vector field of S with respect to g (resp. $\tilde{g}$). The implementations further ask that g(n, ñ)>0 in order to equip (S,g) and (S,$\tilde{g}$) with a coherent orientation.

For energy transposition the implementations consider $$\tilde{f} = \frac{1}{r_0^2}g(\tilde{n}, \partial_\theta)^2 \text{ and } f = \frac{1}{r^2}g(n, \partial_\theta)^2.$$

To check if $\mathcal{S}$ can be an extrusion surface in (M, $\tilde{g}$), the implementations consider the energy:

$$\mathcal{J}_E = \tfrac{1}{\mathcal{A}_s}\int_s \tilde{f}.\tilde{\eta}$$

where $\mathcal{A}_S = \int_s \tilde{\eta}$ (similarly, $\mathcal{A}_S = \int_s \eta$). By comparing pare f to $\tilde{f}$ it appears that $$g(n, \partial_\theta)\eta = Int_{\partial_\theta}(\omega) = \frac{r}{r_0} Int_{\partial_\theta}(\tilde{\omega}),$$

and $\tilde{g}(\tilde{n}, \partial_\theta)\tilde{\eta} = Int_{\partial_\theta}(\tilde{\omega})$ so $g(n, \partial_\theta)\eta = \frac{r}{r_0}\tilde{g}(\tilde{n}, \partial_\theta)\tilde{\eta}.$   5

Further knowing that $$\eta = \rho.\tilde{\eta} \text{ with } = \sqrt{\frac{\det\sigma_x}{\det\tilde{\sigma}_x}},$$

yields:

$$g(n, \partial_\theta) = \frac{r}{\rho r_0}\tilde{g}(\tilde{n}, \partial_\theta)$$

$$f = \left(\frac{1}{\rho}\right)^2 \tilde{f}.$$

Now, $$\boldsymbol{J}_E = \frac{1}{A_s}\int_S \tilde{f}.\tilde{\eta} = \frac{1}{A_s}\int\frac{1}{\rho}\tilde{f}.\eta = \frac{1}{A_s}\int\rho f.\eta$$

In order to compute p the implementations consider $p \in S$ and define $(X,Y) \in T_p S$ as follows:

$$X = \frac{1}{\sqrt{1-(r_0 d\theta(\tilde{n}_p))^2}}\left(dz(\tilde{n}_p)\partial_r - dr(\tilde{n}_p)\partial_z\right)$$

$$Y = \frac{1}{\sqrt{1-(r_0 d\theta(\tilde{n}_p))^2}}\left(-r_0 dr(\tilde{n}_p)d\theta(\tilde{n}_p)\partial_r + \frac{1}{r_0}\left(1-r_0^2 d\theta(\tilde{n}_p)^2\right)\partial_\theta - r_0 dz(\tilde{n}_p)d\theta(\tilde{n}_p)\partial_z\right)$$

where it holds that that:

$$\tilde{g}_p(X, Y) = 0, \tilde{g}_p(X, X) = \tilde{g}_p(Y, Y) = 1$$

$$g_p(X, Y) = 0, g_p(X, X) = 1, g_p(Y, Y) = \left(r_0^2 - r(p)^2\right)d\theta(\tilde{n})^2 + \left(\frac{r(p)}{r_0}\right)^2$$

Considering that fact that $\tilde{\eta}_p(X,Y)=1$ so $\rho(p)=\eta_p(X,Y)=\sqrt{\det G_p}$, with:

$$G_p = \begin{pmatrix} g_p(X, X) & g_p(X, Y) \\ g_p(Y, X) & g_p(Y, Y) \end{pmatrix}$$

By noticing that $$d\theta(\tilde{n}) = \frac{1}{r_0^2}\tilde{g}(n, \partial_\theta)$$

it holds that $$\rho^2 = \left(1-\left(\frac{r}{r_0}\right)^2\right)\tilde{f} + \left(\frac{r}{r_0}\right)^2 = \left(1-\left(\frac{r}{r_0}\right)^2\right)\rho^2 f + \left(\frac{r}{r_0}\right)^2$$

which gives:

$$\rho = \frac{r/r_0}{\sqrt{1-\left(1-\left(\frac{r}{r_0}\right)^2\right)f}}$$

Now making the hypothesis that f is small enough and $$\left(\frac{r}{r_0}\right)$$

is close enough to 1 (or directly that $$\left(1-\left(\frac{r}{r_0}\right)^2\right)f$$

is small), it makes sense to replace $\rho$ by its approximation $$\hat{\rho} = \frac{r}{r_0}.$$

Thus it holds:

$$\boldsymbol{J}_E \approx \frac{1}{A_s}\int_S \hat{\rho}f \cdot \eta = \frac{1}{A_s}\int_S \frac{r}{r_o}f \cdot \eta$$

By noticing $$\tilde{A}_s = \int_S \frac{1}{\rho} \cdot \eta \approx r_0 \int_S \frac{1}{r} \cdot \eta = A_s r_0 \langle\frac{1}{r}\rangle_\eta \text{ where}$$

$$\langle h \rangle_\eta = \frac{\int_S h \cdot \eta}{A_s} = \frac{\int_S h \cdot \eta}{\int_S \eta}.$$

Thus choosing $$r_0^2 = \frac{1}{\langle 1/r \rangle'}$$

gives $A_s \approx r_0 \tilde{A}_s$ and:

$$\boldsymbol{J}_E = \hat{\boldsymbol{J}}_E = \frac{1}{A_s}\int rf \cdot \eta$$

Considering $\xi=(r, \theta, z)$ as the cylindrical coordinates of with respect to a certain axis $\in \mathbb{R}^3$, $|u|=1$, and a certain center $c\in \mathbb{R}^3$, then g can be identified with the usual scalar product on $\mathbb{R}^3$ and the energy may be rewritten as:

$$\hat{J}_E = J_R(u, c) = \tfrac{1}{A_i} \int_S \frac{1}{|p - \pi_{c,u}(p)|} (u \times (p-c) \cdot n)^2 dvol_S$$

Since $vol_s$, the measure on S induced by the Lebesgues measure on $\mathbb{R}^3$, is also the measure associated with the volume form $\eta$.

Thus, the revolution detection energy $J_R$ is derived with respect to the extrusion detection energy $J_E$.

On a surface from a triangle mesh, the energy has the following (exact) discrete expression:

$$J_R(u, c) = \tfrac{1}{A_i} \sum_\tau \frac{A_\tau}{|p_\tau - \pi_{c,u}(p_\tau)|} (u \times (p_\tau - c) \cdot n_\tau)^2$$

where $p_\tau$, $\eta_\tau$, and $A_\tau$ are respectively the center, normal vector and area of triangle $\tau$.

According to the second aspect of the method discussed above, the implementations may solve this non-linear optimization problem of minimizing $J_R$ by first fixing the weights $$\frac{1}{|p_\tau - \pi_{c,u}(p_\tau)|}$$

to a constant value (e.g., 1) and solving the problem via least squares in order to obtain an initial solution for u and c. The implementations may then inject this initial solution into a non-linear optimization solver, e.g., using a Levenberg-Marquardt algorithm.

Noting that $|u\times(p-c)|=|p-\pi_{c,u}(p)|$ where $\pi_{c,u}(p)$ is the projection of the surface point p on the axis defined by u and c. I.e., $|p-\pi_{c,u}(p)|$ is the distance of p to the axis, it is clear that $J_R$ is different from using normalized terms. Using such normalized terms result in a variation of $J_R$ as the following energy function $$J_R^*(u, c) = \tfrac{1}{A_i} \int_S \frac{1}{|p - \pi_{c,u}(p)|^2} (u \times (p-c) \cdot n)^2 dvol_S$$

which is different from $J_R$ in the weight $$\frac{1}{|p - \pi_{c,u}(p)|^2}.$$

Looking at the problem as an extrusion, and unfolding the surface, $J_R$ uses a weight term $$\frac{1}{|p_\tau - \pi_{c,u}(p_\tau)|},$$

thus effectively reducing the influence of points that are closer to the axis, with respect to those that are farther from it.

Generally two types of input mesh may exist:
1. Meshes with uniform density: a consequence of uniform density is that there are more points far from the axis than near the axis, and
2. Meshes generated with 3D software: the number of points is approximately the same at any distance from the axis, but the distance between the points (and thus the size and area of the triangles (or quads)) grows proportionally with the distance.

Figure 10:
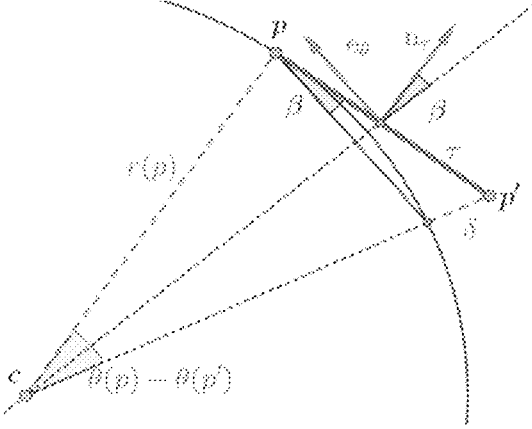

In the second case in particular, it is easier to see that the specific weight used in $J_R$ shows an advantage. This is discussed now in reference to FIG. 10 by considering a 2D example with line segments instead of triangular faces. FIG. 10 displays a case of a line segment $\tau$ whose extreme vertices $p(r(p), \theta(p))$ and $p'(r(p'), \theta(p'))$ satisfy $\delta=r(p)-r(p')$ $\ll 1$. $\delta$ represents typically the effect of noise on the radius coordinate, but it is not proportional to the values of this radius (it is independent from the clean position of the points). Assuming $\theta(p)-\theta(p')$ is small enough (otherwise, the approximation is too coarse), thus $\delta\approx r(p)\sin(\theta(p)-\theta(p'))\sin$ $(\beta)$ ($\beta$ is the angle shown on the figure below). The size of $\tau$ is $A_\tau \approx r(p)\sin(\theta(p)-\theta(p'))$, but by hypothesis it should be proportional to r meaning that $\sin(\theta(p)-\theta(p'))$ can be considered as a constant $\alpha$. By noticing that $\sin(\beta)=n_\tau\cdot e_\theta$, that the integrated energy according to $J_R^*$ on this "face" alone would be:

$$A_\tau(n_\tau \cdot e_\theta)^2 \approx ar(p)\sin(\beta)^2 = \frac{\delta^2}{ar(p)}.$$

In other words, for the same level of noise in this case, the energy according to $J_R^*$ favors faces being located further away from the center, whereas the energy according to $J_R$ (in this case the energy for $\tau$ would be $$\frac{\delta^2}{a})$$

does not. In the general case, the error on normal vectors is estimated to be greater when the level of curvature is higher, which provides a justification for using $J_R$ that compensates this effect by multiplying the local energy of $J_R^*$ by $\tau$.

Unfolding

Once the axis has been detected, the implementations define the transformation $\Phi_R$ and unfold the geometry (i.e., the skin portion) into an extrusion surface. As discussed above, and in line to the first aspect of the method discussed above, the implementations may apply the solutions proposed for extrusion surfaces in the cited European Patent Application No. 21305673.2 and No. 21305671.6. In order to perform the unfolding, after translating and aligning the surface with coordinate system (so that the z-axis becomes the axis of revolution), the implementations may compute the cylindrical coordinates $(r, \theta, z)$ for each Cartesian point $p=(x,y,z)$. The cylindrical coordinates are defined by $$r = |u \times p|$$

$$e = \frac{p - (p\cdot u)u}{|p - (p\cdot u)u|}$$

$$\cos\theta = e\cdot e_x$$

$$\sin\theta = (e_x \times e)\cdot u$$

where $e_x$ is the direction vector of the x-axis. However, in practice, computing the angle $\theta$ independently for each point, makes it difficult to compute angular intervals actually covered by the surface. Using such independent computations, for instance, it is possible to compute two disjointed intervals covered by a single surface, as illustrated in FIG. 5. In order to avoid this, and in reference to FIG. 6, the implementation takes advantage of the topology to propagate (i.e., explore) the computation from a randomly selected initial point $p_0$, that must not be located on the axis, towards its neighbors (as long as they aren't located on the axis either) by $$e_i = \frac{p_i - (p_i \cdot u)u}{|p_i - (p_i \cdot u)u|}$$

$$\cos(\theta_{i+1} - \theta_i) = e_i \cdot e_{i+1}$$

$$\sin(\theta_{i+1} - \theta_i) = (e_i \times e_{i+1}) \cdot u.$$

Using such an idea enables the implementations to obtain a connected surface as illustrated in FIG. 7.

On a mesh, the neighbors of a vertex are its adjacent vertices (i.e., connected by an edge), whereas in a point cloud, the neighbors of a point may be the k nearest points in the cloud. In the latter case, proximity is defined using all available information, e.g., point coordinates, but also, if available, normal vectors and/or curvature values. All points located on the axis are supposed to be on the surface border and are associated with an angular value of 0. Since $e_i$ and $e_{i+1}$ are neighbors, the interval $[\theta_i, \theta_{i+1}]$ is fully covered by the surface, and the continuity of the field of angle values over the mesh or the point cloud is maintained.

To generate an object that approximately reflects the proportions of the surface, were it unfolded in this way (and to therefore ensure that subsequent computations are numerically valid), the implementations may also scale the unfolded surface along the $\theta$ direction, in order to avoid very short or very long extrusions, depending on the extension of the surface along the r- and z-axis.

Figure 9:
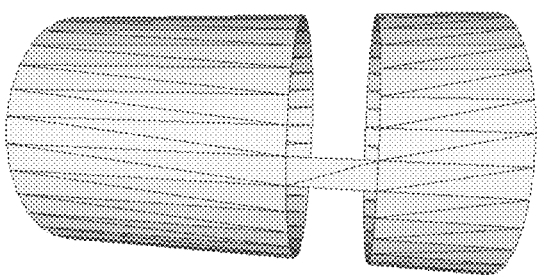

For full revolution surfaces, as illustrated in FIGS. 8 to 9, the implementations may interrupt the propagation where vertices that already been processed (i.e., explored) are encountered (i.e., explored). The implementation may remove the connecting edge and its adjacent triangles (in the case of a mesh) whenever the angular distance between two neighboring points is too high, e.g., larger than $\pi$. The implementation may remove the edge 8010 and its triangles from the mesh when unfolding the surface. The removing of such edges leads to loss of data, which in the general case dense meshes is rarely a problem, but may occur for coarse, non-uniform meshes as illustrated in FIG. 9. In some variations, the implementations may duplicate one of the two vertices of the edge (by adding or removing $2\pi$ from its angle) so as to keep the edge and its triangles in the unfolded result.

In order to avoid the generation of disjointed unfolded meshes and in case of a mesh, the implementations perform the propagation along the triangles, rather than along the vertices, and compute angular values for the triangle barycenters. This ensures that the resulting unfolded mesh is connected.

Applications

Since the surface of revolution has been unfolded into an extrusion surface (that uses the exact same profile curve in the rz-plane), the implementation may now apply existing technological solutions for extrusion surfaces and exploit their results for the surface of resolution according to the first aspect of the method. These may include, but are not limited to, the a posteriori extrusion detection of false positives via Monte-Carlo shadow estimation according to already cited European Patent Application DS2020-29, and/or a natural surface parameterization according to already cited European Patent Applications DS2020-23, the result of which can be then used to robustly compute a profile curve (avoiding overfitting problems that may occur when fitting a curve to a planar point cloud). Using these methods are possible as the implementations transpose the topological information to the extrusion surface, i.e., neighboring vertices on the surface of revolution remain neighbors on the extrusion surface.

Using Monte-Carlo shadow estimation as discussed above may make the extrusion detection (and in general CAD processing) more robust. In particular, knowing a candidate extrusion surface and a potential extrusion direction, using this method can provide additional conditions to make sure the surface approximates an extrusion in a stronger sense, and that it is not just a surface that happens to have good normal vectors. This kind of algorithm makes the detection behave far better in the presence of noise. This Monte-Carlo shadow estimation method may be used on a potential revolution surface after unfolding, with the potential extrusion direction $e_\theta$.

The implementations, after detecting an extrusion surface and computing the respective axis and center, may computes an angle parameterization over the whole surface with basic trigonometry. In particular, the implementations may compute the parameterization that follows the profile (i.e., is oriented in the tangent direction orthogonal to the angle direction $e_\theta$) according to the techniques of already cited European Patent Application No. 21305671.6 directly on revolution surface meshes. Alternatively, the implementations may use the same technique use on the extrusion mesh obtained after unfolding, which is an approximation of a flat surface (no intrinsic curvature), implying that the PDE to solve has a simpler form.

Further, since the transformation is isometric in the r, z coordinates, in order to find the profile of the revolution surface it suffices to compute the profile of the extrusion surface after unfolding, which can be made for instance using the parameterization introduced above, projection of the vertices along the extrusion direction and curve fitting on a parameterized point cloud on a plane.

The invention claimed is:

1. A computed-implemented method for processing a computer-aided design 3D model of a mechanical part including a portion having a distribution of material, the method comprising:

obtaining the 3D model, the 3D model including a skin portion of the 3D model representing an outer surface of the portion of the mechanical part; and processing the skin portion based on an extrusion-processing algorithm, where a transform of the skin portion is inputted to the algorithm, the transform representing an unfolding of the distribution of material of the portion, the transform being a mapping $\Phi R: \mathbb{R}^3 \to \mathbb{R} + X [-\pi,\pi[ \times \mathbb{R}$ defined for all $p \in \mathbb{R}^3$ by $\chi_R(p) = \Phi(R(p-c))$, where $\Phi: \mathbb{R}^3 \to R + X [-\pi,\pi[ \times R$ is a transformation of $\mathbb{R}^3$ which converts Cartesian coordinates $(x,y,z) \in \mathbb{R}^3$ to cylindrical coordinates $(r(x,y),\theta(x,y),z) \in \mathbb{R}^3$, where R is a rotation which rotates $u_R$ to a z-axis, and where c is a point and $u_R$ is a vector, the point c and the vector $u_R$ defining a revolution axis for the skin portion.

2. The method of claim 1, wherein processing the skin portion based on an extrusion-processing algorithm comprises:

unfolding the skin portion, thereby obtaining the transform, inputting the transform to the extrusion-processing algorithm, and running the extrusion-processing algorithm.

3. The method of claim 2, wherein the extrusion-processing algorithm comprises:

determining whether or not the transform of the skin portion represents an outer surface of a distribution of material arranged as an extrusion; and/or computing an extrusion profile.

4. The method of claim 1, wherein the processing of the skin portion based on an extrusion-processing algorithm comprises a material revolution detection in the portion of the mechanical part, the material revolution detection including determining the revolution axis by optimizing an objective function penalizing non-orthogonality of a normal of the skin portion to a rotation direction orthogonal to a candidate revolution axis to an extent which is increasingly proportional to a distance to the revolution axis.

5. The method of claim 4, wherein the objective function is of a type:

$$\mathcal{J}_R(u, c) = \tfrac{1}{\mathcal{A}_s}\int_S \frac{1}{|p - \pi_{c,u}(p)|}(u \times (p - c)\cdot n)^2 dvol_S,$$

where u is a direction of the candidate revolution axis, c is an origin of the candidate revolution axis, $\mathcal{A}_S$ is an area of the skin portion, S is the skin portion, p is a position on the skin portion, $\pi_{c,u}(p)$ is an orthogonal projection of p on the candidate revolution axis, and n is a normal to the skin portion at position p.

6. The method of claim 1, wherein the unfolding comprises:

obtaining the revolution axis, determining a cylindrical coordinate specification of the skin portion, the cylindrical coordinate specification including first values each specifying a respective position on the skin portion relative to a cylindrical coordinate system having a longitudinal axis which is the revolution axis, and determining a Cartesian coordinate specification of the transform, relative to a Cartesian coordinate system having one axis which is the longitudinal axis, the Cartesian coordinate specifications including second values specifying positions on the transform, the second values corresponding to the first values.

7. The method of claim 6, wherein the skin portion is represented by a 3D discrete geometrical representation having discrete elements and the determining of the cylindrical coordinate specification of the skin portion comprises determining the first values for each discrete element of the 3D discrete geometrical representation.

8. The method of claim 7, wherein the first values of the cylindrical coordinate specification consist of, for each discrete element, values of:

a radial distance which is a norm of a radial vector with respect to the longitudinal axis, an angular position on the skin portion with respect to the radial vector and the longitudinal axis, and a longitudinal position which designates a position on the longitudinal axis.

9. The method of claim 8, wherein the determining of the cylindrical coordinate specification includes computing the values of the angular position by exploring discrete elements of the 3D discrete geometrical representation, and for each explored discrete element, computing angular positions of neighboring discrete elements of the explored discrete element.

10. The method of claim 9, wherein the computing of the values of the angular positions of neighboring discrete elements of the explored discrete element includes duplicating one or more of the neighboring discrete elements for which a difference with the angular position of the explored discrete element is larger than a threshold.

11. The method of claim 9, wherein the values of the angular position are of a type:

$$e_i = \frac{p_i - (p_i \cdot u)u}{|p_i - (p_i \cdot u)u|}$$

$$\cos(\theta_{i+1} - \theta_i) = e_i \cdot e_{i+1}$$

$$\sin(\theta_{i+1} - \theta_i) = (e_i \times e_{i+1}) \cdot u,$$

where u is the longitudinal axis, $p_i$ is a cartesian position vector of an explored discrete element i, $\theta_i$ is a value of the angular position for the explored discrete element, $\theta_{i+1}$ is a value of the angular position of a neighbor i+1 of the explored discrete element i.

12. The method of claim 8, further comprising: scaling the values of the angular position.

13. A non-transitory computer readable storage medium having recorded thereon a computer program including instructions for performing a method for processing a computer-aided design 3D model of a mechanical part including a portion having a distribution of material, the method comprising:

obtaining the 3D model, the 3D model including a skin portion of the 3D model representing an outer surface of the portion of the mechanical part; and processing the skin portion based on an extrusion-processing algorithm, where a transform of the skin portion is inputted to the algorithm, the transform representing an unfolding of the distribution of material of the portion, the transform being a mapping $\Phi R: \mathbb{R}^3 \to \mathbb{R} + X [-\pi, \pi[ \times \mathbb{R}$ defined for all $p \in \mathbb{R}^3$ by $\chi_R(p) = \Phi(R(p-c))$, where $\Phi: \mathbb{R}^3 \to R + X [-\pi, \pi[ \times R$ is a transformation of $\mathbb{R}^3$ which converts Cartesian coordinates $(x,y,z) \in \mathbb{R}^3$ to cylindrical coordinates $(r(x,y), \theta(x,y), z) \in \mathbb{R}^3$, where R is a rotation which rotates $u_R$ to a z-axis, and where c is a point and $u_R$ is a vector, the point c and the vector $u_R$ defining a revolution axis for the skin portion.

14. The non-transitory computer readable storage medium of claim 13, wherein processing the skin portion based on an extrusion-processing algorithm comprises:

unfolding the skin portion, thereby obtaining the transform, inputting the transform to the extrusion-processing algorithm, and running the extrusion-processing algorithm.

15. The non-transitory computer readable storage medium of claim 14, wherein the extrusion-processing algorithm comprises:

determining whether or not the transform of the skin portion represents an outer surface of a distribution of material arranged as an extrusion, and/or computing an extrusion profile.

16. The non-transitory computer readable storage medium of claim 13, wherein the processing of the skin portion based on an extrusion-processing algorithm comprises a material revolution detection in the portion of the mechanical part, the material revolution detection comprising determining the revolution axis by optimizing an objective function penalizing non-orthogonality of a normal of the skin portion to a rotation direction orthogonal to a candidate revolution axis to an extent which is increasingly proportional to a distance to the revolution axis.

17. A system comprising:

a processor coupled to a memory and a graphical user interface, the memory having recorded thereon a computer program including instructions for processing a computer-aided design 3D model of a mechanical part including a portion having a distribution of material that when executed by the processor causes the processor to be configured to:

obtain the 3D model, the 3D model including a skin portion of the 3D model representing an outer surface of the portion of the mechanical part, and process the skin portion based on an extrusion-processing algorithm, where a transform of the skin portion is inputted to the algorithm, the transform representing an unfolding of the distribution of material of the portion, the transform being a mapping $\Phi R$: $\mathbb{R}^3 \to \mathbb{R} + X$ $[-\pi,\pi[x$ $\mathbb{R}$ defined for all $p \in \mathbb{R}^3$ by $\chi_R(p)=\Phi(R(p-c))$, where $\Phi$: $\mathbb{R}^3 \to R + X$ $[-\pi,\pi[x$ $R$ is a transformation of $\mathbb{R}^3$ which converts Cartesian coordinates $(x,y,z) \in \mathbb{R}^3$ to cylindrical coordinates $(r(x,y),\theta(x,y),z) \in \mathbb{R}^3$, where R is a rotation which rotates $u_R$ to a z-axis, and where c is a point and $u_R$ is a vector, the point c and the vector $u_R$ defining a revolution axis for the skin portion.

18. The system of claim 17, wherein the processor is further configured to process the skin portion based on an extrusion-processing algorithm by being further configured to:

unfold the skin portion, thereby obtaining the transform, input the transform to the extrusion-processing algorithm, and run the extrusion-processing algorithm.

19. The system of claim 18, wherein the extrusion-processing algorithm causes the processor to:

determine whether or not the transform of the skin portion represents an outer surface of a distribution of material arranged as an extrusion, and/or compute an extrusion profile.

20. The system of claim 17, wherein the processor is further configured to process of the skin portion based on an extrusion-processing algorithm by being further configured to implement a material revolution detection in the portion of the mechanical part, the material revolution detection causing the processor to be configured to determine the revolution axis by optimizing an objective function penalizing non-orthogonality of a normal of the skin portion to a rotation direction orthogonal to a candidate revolution axis to an extent which is increasingly proportional to a distance to the revolution axis.

* * * * *